United States Patent [19]

Shimura et al.

[11] Patent Number: 5,719,530
[45] Date of Patent: Feb. 17, 1998

[54] HIGH POWER BIPOLAR TRANSISTOR DEVICE

[75] Inventors: Teruyuki Shimura; Manabu Katoh, both of Tokyo, Japan

[73] Assignee: Mitsubishi Denki Kabushiki Kaisha, Tokyo, Japan

[21] Appl. No.: 634,966

[22] Filed: Apr. 19, 1996

[30] Foreign Application Priority Data

Sep. 8, 1995 [JP] Japan .................. 7-231162

[51] Int. Cl.$^6$ .................. H03F 3/60; H03F 3/68
[52] U.S. Cl. .................. 330/286; 330/295
[58] Field of Search .................. 330/53, 286, 295, 330/307

[56] References Cited

U.S. PATENT DOCUMENTS

| | | | |
|---|---|---|---|
| 3,564,443 | 2/1971 | Nagata | 330/307 |
| 3,963,993 | 6/1976 | Hoffman et al. | 330/286 X |
| 4,835,496 | 5/1989 | Schellenberg et al. | 330/286 X |

FOREIGN PATENT DOCUMENTS

| | | | |
|---|---|---|---|
| 93407 | 7/1981 | Japan | 330/286 |
| 6-310955 | 11/1994 | Japan . | |

OTHER PUBLICATIONS

Kim et al., "Thermal Analysis And Power Characteristics Of A Power HBT For Locomotive Communication", IEICE Technical Report, 1995–07, pp. 95–101.

*Primary Examiner*—James B. Mullins
*Attorney, Agent, or Firm*—Leydig, Voit & Mayer, Ltd.

[57] ABSTRACT

A high power bipolar transistor includes bipolar transistors disposed on a substrate; a signal line including a pad for inputting a driving signal and a signal transmission line continuous with the pad commonly connecting base electrodes of the bipolar transistors; and a bypass line having a first end connected to the signal transmission line proximate to the pad and a second end connected to the signal transmission line remote from the pad. Approximately equal powers are supplied to the transistors connected to any position on the base feed line so that the operation of the respective transistors is uniform, improving output power and efficiency.

16 Claims, 31 Drawing Sheets

HIGH POWER BIPOLAR TRANSISTOR DEVICE

FIELD OF THE INVENTION

The present invention relates to a high power bipolar transistor and, more particularly, to a high power bipolar transistor in which the same RF signals are applied to respective transistors when a plurality of bipolar transistors, which are connected in parallel with each other are operated.

BACKGROUND OF THE INVENTION

In bipolar transistors, in order to improve frequency characteristics and to avoid the current crowding effect, the size of the emitter is required to be minimized. Therefore, a plurality of unit transistors are Grouped and connected with each other to perform a parallel operation, or an input signal is supplied to the respective Groups from a plurality of electrodes. FIG. 31 illustrates a construction of a high power bipolar transistor disclosed in, "Thermal analysis and power characteristics of a power HBT for locomotive communication (IEICE Technical Report 1995-07, p95–101)". The prior art high power HBT shown in this figure has a construction in which a plurality of unit transistors are connected to a common wiring called a base feed line to be Grouped into a Group. In the figure, reference numeral 200 designates a substrate, numeral 30 designates a signal input line comprising a base pad 30a to which an RF signal is input and an input feed line 3ob extending from the base pad 30a. Numeral 33 designates a plurality of wirings extending from the input feed line 30b and unit transistors are connected to the ends of the wirings 33. Numeral 31 designates a base electrode of a bipolar transistor (hereinafter referred to as HBT) and numeral 32 designates an emitter electrode of the HBT. A collector electrode which is disposed in the vicinity of the emitter electrode 32 is not shown in the figure.

FIG. 32 is a diagram illustrating an equivalent circuit of the transistor circuit shown in FIG. 31 and a description is given of the operation of the transistor circuit with reference to FIG. 32. An RF signal input to the base pad 30a propagates on the input feed line 30b, it is input to the base electrodes 31 of the respective transistors via the wirings 33 connected to the input feed lines 30b, and the respective transistors are operated in parallel, thereby outputting a signal which is a sum of the outputs of the respective transistors connected with each other.

In the prior art high power bipolar transistor constructed as described above, however, the RF signal is input by a larger amount to the input electrodes of the transistors which are connected to positions in the vicinity of the base pad 30a and the RF signal is input to the input electrode located in the vicinity of the terminating end of the input feed line 30b which is located far from the base pad 30a, by a lesser amount, whereby non-uniform operations are performed over the transistors, resulting in reduction in the output power and efficiency. In other words, as shown in the equivalent circuit shown in FIG. 32, the RF signal $i_0$ input to the base pad 30a is attenuated in its amplitude by the base wiring resistance R1, and the phase thereof is inverted by the inter-base emitter capacitances $C_{BE}$. Accordingly, different RF signals $i_1$–$i_5$ are input to the respective unit HBTs. As a result, the amplitude of the output signal which is obtained when those input signals are amplified by the respective unit HBTs and thereafter synthesized, is reduced by the base wiring resistances R1 and the inter-base emitter capacitances $C_{BE}$.

In the prior art high power bipolar transistor constructed as described above, since the input signal is supplied to the respective transistors via wirings connected with the common input feed line, the input RF signal is input in a larger amount to the transistors located close to the input side and the transistors located far from the input side, whereby an RF input of lesser amount is input to the transistor closer to the rear stage and non-uniform operation of transistors occur, resulting in a reduction in the output power and efficiency.

SUMMARY OF THE INVENTION

It is an object of the present invention to provide a high power bipolar transistor in which uniform power is supplied to respective unit transistors when a plurality of unit transistors are operated in parallel and connected to a common feed line.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, a high power bipolar transistor comprises:

- a plurality of bipolar transistors disposed on a substrate;
- a signal line including a pad for inputting a driving signal applied from the outside and a signal transmission line formed continuously with the pad, which signal transmission line commonly connects the base electrodes of the plurality of bipolar transistors;
- a bypass line having an end connected to the signal transmission line in the vicinity of the pad and another end connected to the signal transmission line in the vicinity of the terminating end of the signal transmission line.

According to a second aspect of the present invention, in the above-described high power bipolar transistor, an end of the bypass line is connected to the signal transmission line at a point on the signal transmission line closer to the pad than the node connecting the base electrode of the transistor that is closest to the pad with the signal transmission line.

According to a third aspect of the present invention, in the above-described high power bipolar transistor, an auxiliary bypass line is provided, having an end connected to the signal transmission line at a position closer to the signal terminating end than the node connecting an end of the bypass line with the signal transmission line and another end connected to the signal transmission line at a position closer to the pad than the node connecting the other end of the bypass line with the signal transmission line.

According to a fourth aspect of the present invention, in the above-described high power bipolar transistor, the bypass line is provided above the signal transmission line comprising an air bridge or a wire.

According to a fifth aspect of the present invention, in the above-described high power bipolar transistor, the bypass line is provided above the signal transmission line comprising an air bridge or a wire, and an end of the bypass line is connected to the signal transmission line at a point closer to the pad than a point at which the base electrode of the transistor that is closest to the pad is connected to the signal transmission line.

According to a sixth aspect of the present invention, in the above-described high power bipolar transistor, a branching line is provided in the way of the bypass line and the end of the branching line is connected with the signal transmission line at a point located intermediately between points where the one end and the other end of the bypass line are respectively connected with the signal transmission line.

According to a seventh aspect of the present invention, a high power bipolar transistor comprises:

a plurality of bipolar transistors disposed on a substrate; and a signal line including a pad for inputting a driving signal applied from the outside, a first signal transmission line formed continuously with the pad, which commonly connects base electrodes of a first group of transistors positioned far from the pad among the plurality of bipolar transistors, and a second signal transmission line formed continuously with the pad, which commonly connects base electrodes of a second group of transistors positioned close to the pad among the plurality of transistors.

According to an eighth aspect of the present invention, in the above-described high power bipolar transistor, the second signal transmission line has a line width finer than that of the first signal transmission line.

According to a ninth aspect of the present invention, in the above-described high power bipolar transistor, the lengths of the first signal transmission line and the second signal transmission line are set so that wiring lengths from the pad to the respective bipolar transistors are equal to each other.

According to a tenth aspect of the present invention, in the above-described high power bipolar transistor, the sum of the emitter area of the first group of transistors connected to the first signal transmission line and the sum of the emitter area of the second group of transistors which are connected to the second signal transmission line are equal to each other.

According to an eleventh aspect of the present invention, a high power bipolar transistor comprises:

a plurality of bipolar transistors disposed on a substrate;

a pad for inputting a driving signal applied from the outside;

a plurality of signal transmission lines formed continuously with the pad, which signal transmission lines are independently connected to the plurality of bipolar transistors, respectively, According to a twelfth aspect of the present invention, in the above-described high power bipolar transistor, the line widths of the plurality of signal transmission lines, where the signal transmission lines connect from bipolar transistors located far from the pad to bipolar transistors located close to the pad, are made as finer as closer to the pad.

According to a thirteenth aspect of the present invention, in the above-described high power bipolar transistor, the lengths of the respective signal transmission lines are set, so that the wiring lengths of the respective signal transmission lines from the respective bipolar transistors to the pad are equal to each other.

According to a fourteenth aspect of the present invention, a high power bipolar transistor comprises:

a plurality of bipolar transistors disposed on a substrate;

a signal line comprising a pad for inputting a driving signal applied from the outside and a signal transmission line formed continuously with the pad which connects base electrodes of the plurality of the bipolar transistors;

a bypass line comprising a signal transmission line formed by producing an aperture on the signal transmission line part in the longitudinal direction of the signal transmission line extending from the vicinity of the pad to the vicinity of the terminating end of the signal transmission line.

According to a fifteenth aspect of the present invention, in the above-described high power bipolar transistor, the aperture is provided in plurality, corresponding to the plural high power bipolar transistors, covering from the pad to points at which the base electrodes of the respective transistors are connected with the signal transmission line.

According to a sixteenth aspect of the present invention, in the above-described high power bipolar transistor, as the respective high power bipolar transistors, a transistor having a collector at the periphery of an emitter is employed.

According to a seventeenth aspect of the present invention, in the above-described high power bipolar transistor, as the respective high power bipolar transistors, a transistor having an emitter at the periphery of a collector is employed.

DETAILED DESCRIPTION OF THE PREFERRED EMBODIMENTS

Embodiment 1

Figure 1:
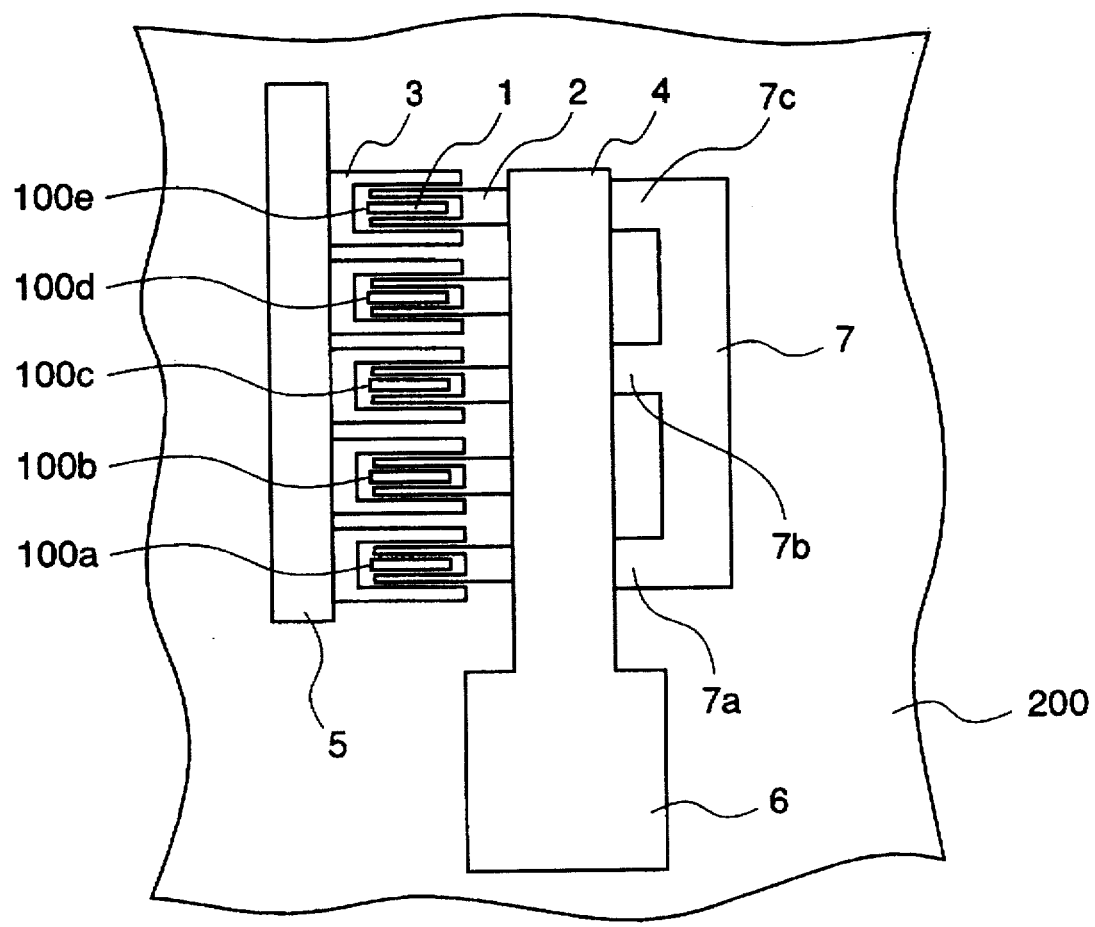
FIG. 1 is a diagram illustrating a fundamental structure of a high power bipolar transistor as a first example according to a first embodiment of the present invention.

A description is given of a first embodiment of the present invention. FIG. 1 is a diagram illustrating a construction of a high power bipolar transistor as a first example according to a first embodiment of the present invention. In this figure, the ground emitter bipolar transistors $100a$–$100e$ are connected to a common signal input line as one group. The emitter wiring is not shown for simplification. The emitters 1 of the respective transistors $100a_1$–$100e$ are grounded and a bias voltage is applied to a collector (not shown) via a collector output terminal (not shown), a collector feed line 5, and a collector electrode 3. In addition, the emitter is grounded, electrically connected to a metal layer provided at the rear surface of the substrate via such as a through hole formed in the substrate 200. Reference numeral 6 designates a pad (base input terminal) to which an RF signal is input, and numeral 4 designates a base feed line connected to the pad 6. The pad 6 and the base feed line 4 form a signal input line. In addition, the base feed line 4 and the base electrodes 2 of the plurality of bipolar transistors are electrically connected. Reference numeral 7 designates a bypass line having an end $7a$ connected in the vicinity of the pad 6 of the base feed line 4 and another end $7c$ connected in the vicinity of the terminating end of the base feed line 4. A branching portion $7b$ of the bypass line 7 is connected in the vicinity of the center of the base feed line 4. This bypass line 7 is a metal pattern on the substrate 20, similarly to the wiring for the base feed line 4.

The function and effect of the device will be described.

An RF signal input from the base input terminal 6 and a bias current are supplied to the respective transistors $100a$–$100e$ via the base feed line 4 and the respective base electrodes 2, signals amplified by the respective transistors $100a$–$100e$ are output through the collector electrode 3 and a collector feed line 5. Then, because a bypass line 7 branching from the input feed line 4 is provided, the attenuation of the input signals which are supplied to the respective transistors $100a$–$100e$ on the base feed line 4 become approximately equal to each other.

Particularly, among the transistors $100a$–$100e$ positioned in the order of a–c from one closest to the pad 6, a current that is the sum of a current flowing supplied to the branching portion $7b$ of the bypass line 7 and a current flowing through the base feed line 4 is supplied to the transistors $100c$–$100d$, and a current that is the sum of a current supplied from the other end 7c of the bypass line 7 and a current flowing through the base feed line 4 is supplied to the transistor 100e.

Figure 2:
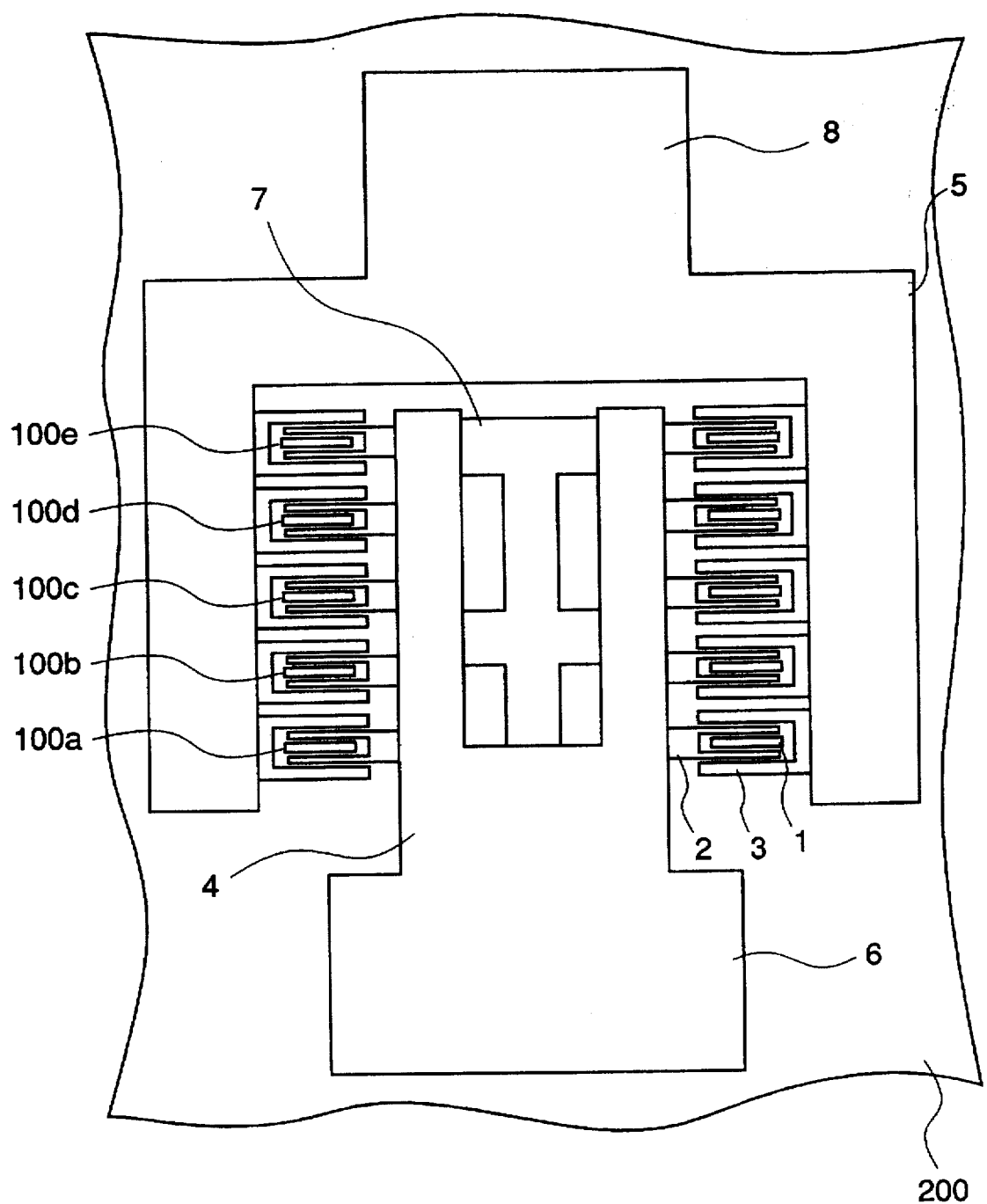
FIG. 2 is a diagram illustrating a layout when the high power bipolar transistor as the first example according to the first embodiment shown in FIG. 1 is applied to an actual circuit.

As described above, a current affected by attenuation in the base feed line 4 is supplied to the respective transistors 100a–100e and a current not affected by the attenuation is supplied to the transistors 100c and 100d. Further, a current not affected by the attenuation is supplied to the transistor 100e, and approximately equal powers are supplied to the transistors 100a–100e connected to any positions on the base feed line 4, whereby the operations of the respective transistors 100a–100e are made uniform, improving the output power and efficiency. FIG. 2 shows a construction where the transistor circuit shown in FIG. 1 is fabricated as an actual circuit. In this actual circuit, in view of integration, the circuit shown in FIG. 1 is provided at symmetrical positions with the base feed line 4 positioned at the center.

In FIG. 1, the branching portion 7b of the bias line 7 is not connected to the center of a portion of the base feed line 4 over which five transistors are connected at equal spacing, but is connected to a position closer to the terminating end of the base feed line 4. This is to supply a signal supplementarily from the bias line 7 to the transistor positioned closer to the terminating end because the signal supplied from the base feed line 4 is smaller closer to the terminating end. To which portion of the base feed line 4 the branching portion 7b of the bypass line 7 is to be connected, is determined so that the signal supplied to the respective transistors 10a–100e is made uniform on the basis of various parameters such as use frequency and the length of the base feed line. Here, it is to be noted that signals supplied from the branching portion 7b and the other portion 7c of the bypass line 7 propagate in a direction reverse to that of the propagation of the signal which is originally supplied to the pad 6.

Figure 3:
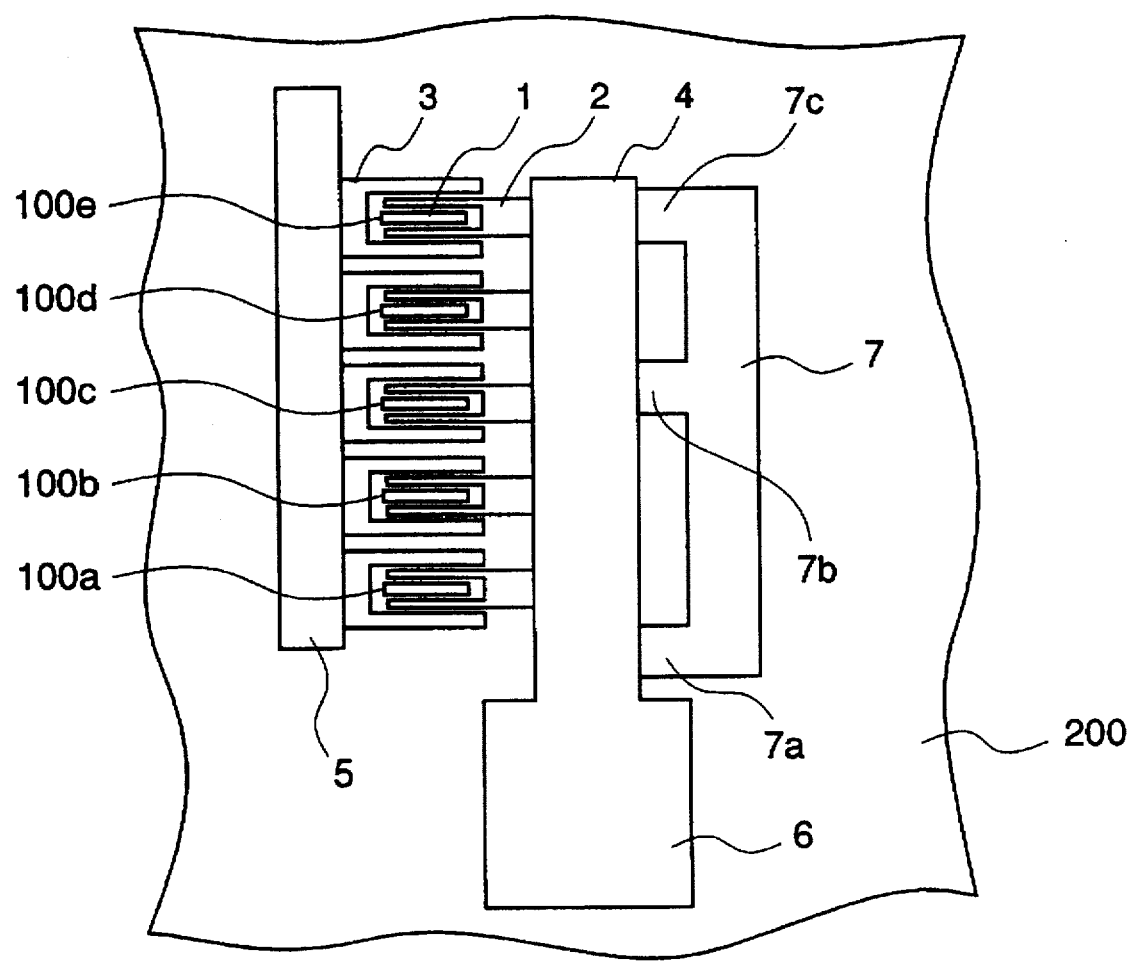
FIG. 3 is a diagram illustrating a fundamental structure of a high power bipolar transistor as a second example according to the first embodiment.
Figure 4:
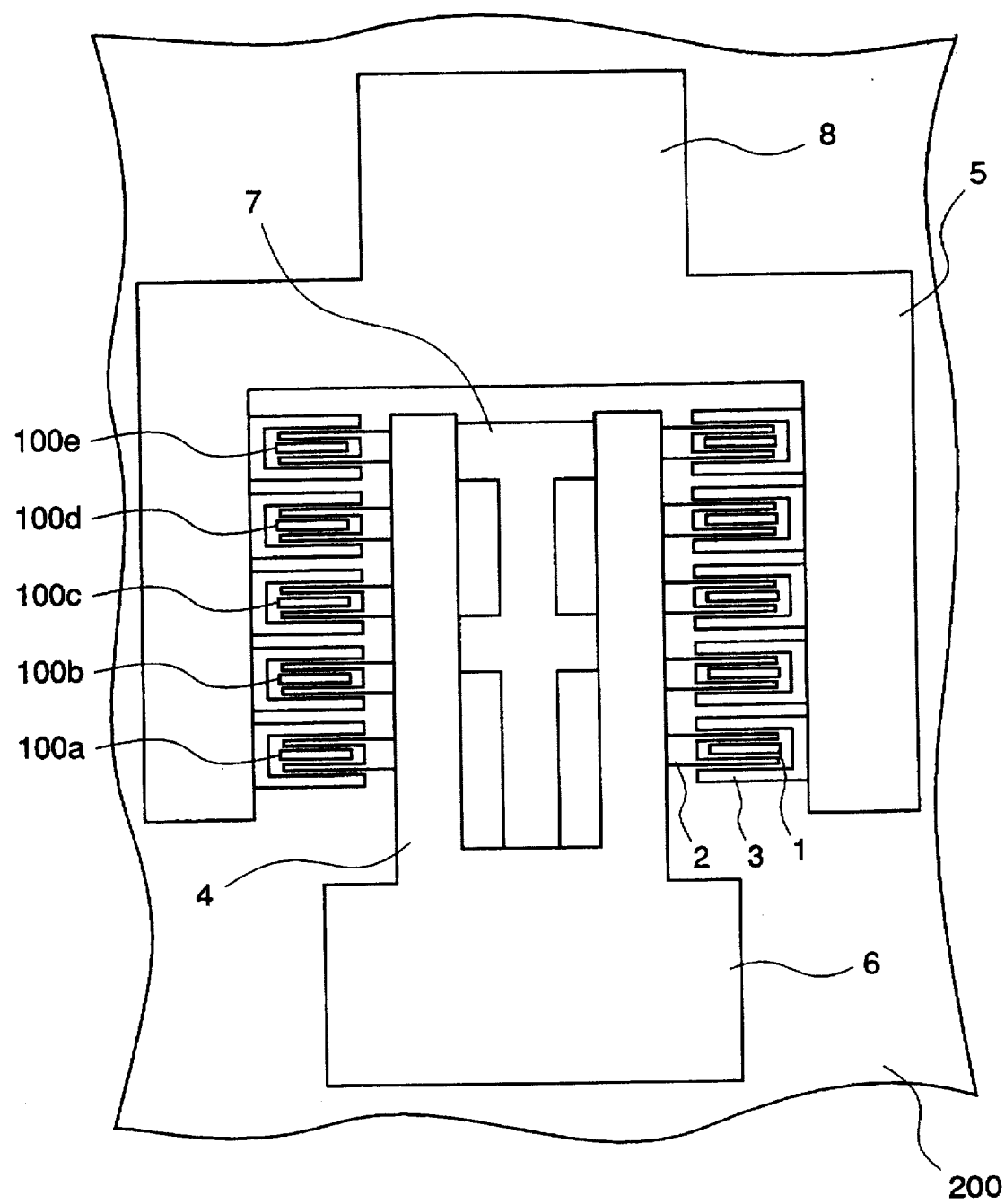
FIG. 4 is a diagram illustrating a layout when the high power bipolar transistor of the second example according to the first embodiment shown in FIG. 2 is applied to an actual circuit.

FIG. 3 is a diagram illustrating a high power bipolar transistor as a second example according to the first embodiment of the present invention shown in FIG. 1. FIG. 4 is a diagram illustrating a layout pattern when the second example is fabricated as an actual circuit. As shown in these figures, the end 7a of the bypass line 7 is connected to a portion of the base feed line 4 that is closest to the RF input terminal 6 relative to the RF input terminal 6 as compared with the bipolar transistor according to the first embodiment. Therefore, a signal not affected by the attenuation due to the transistor 100a flows through the bypass line 7. Accordingly, even when the characteristics of the transistor 100a vary due to some factor, there is no influence on the signal flowing through the bypass line 7, whereby a transistor circuit having a stable device characteristics is fabricated.

Figure 5:
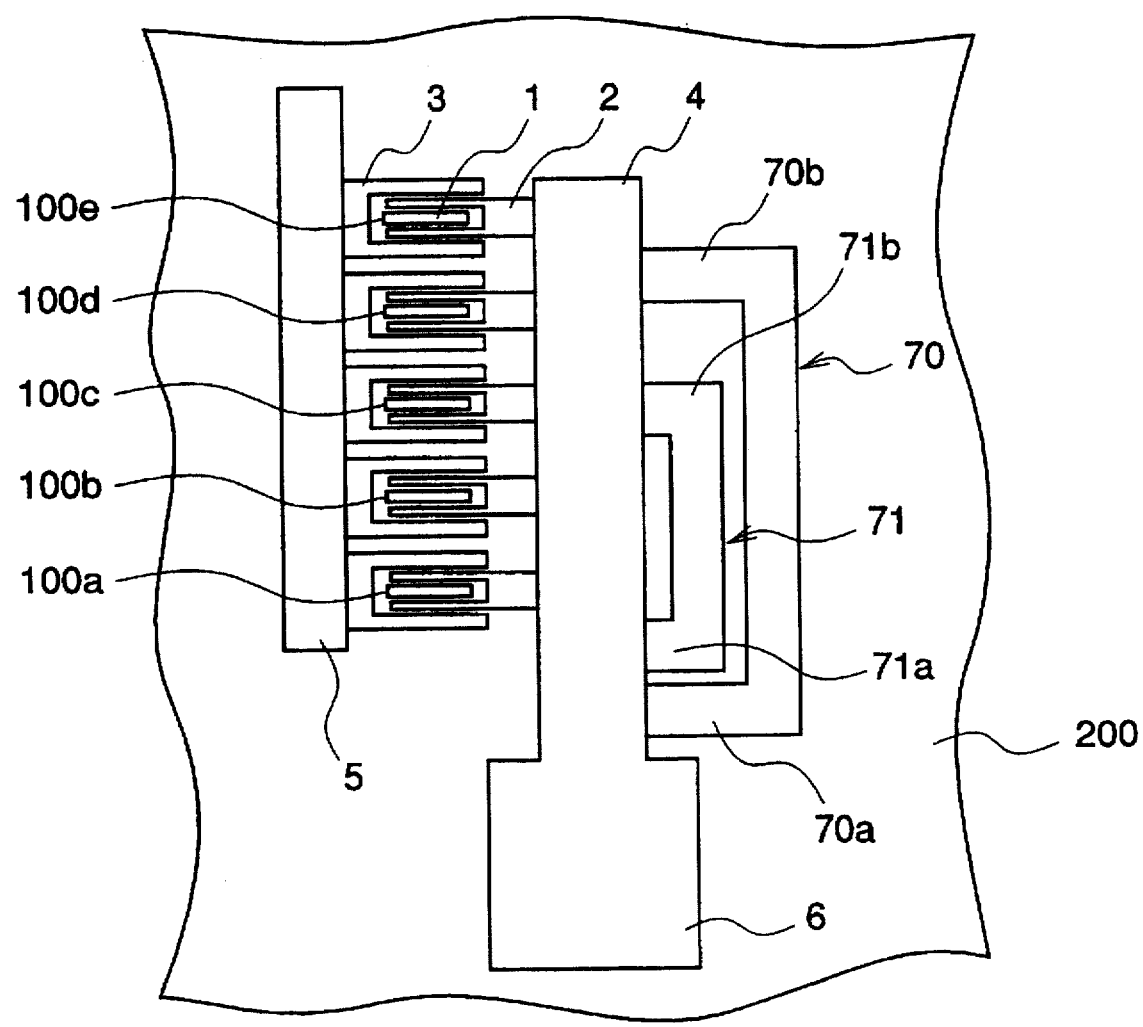
FIG. 5 is a diagram illustrating a fundamental structure of a high power bipolar transistor as a third example according to the first embodiment.
Figure 6:
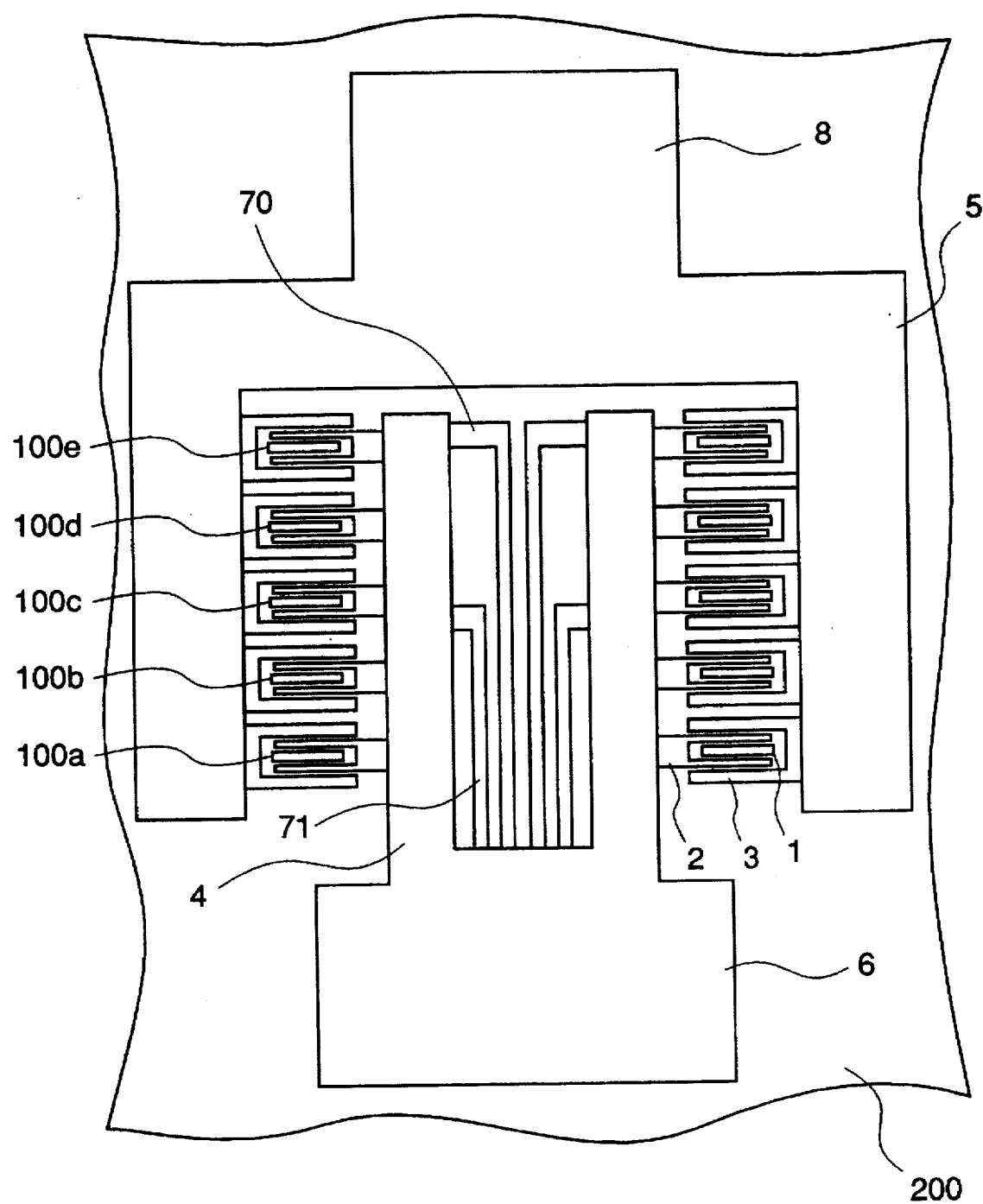
FIG. 6 is a diagram illustrating a layout when the high power bipolar transistor of the third example according to the first embodiment shown in FIG. 5 is applied to an actual circuit.

FIG. 5 is a diagram illustrating a high power bipolar transistor as a third example according to the first embodiment of the present invention shown in FIG. 1. FIG. 6 is a diagram illustrating a layout pattern when the third example is fabricated as an actual circuit. In these figures, two bypass lines are provided, the ends 70a and 71a of the bypass lines 70 and 71 are connected to portions of the base feed line 4 closer to the pad 6 than to the transistor 100a, the end 70b of the bypass line 70 is connected to a portion of the base feed line 4 closer to the terminating end of the base feed line 4, the end 71b of the bypass line 71 with the end 71a of which is connected to a portion of the base feed line 4 farther from the pad 6 than the end 70a of the bypass line 70, is connected to a portion of the base feed line 4 closer to the center of the base feed line 4.

By providing such wiring, as compared with the device having the branching portion 7b in the bypass line 7 as shown in FIG. 1, the attenuation of the input signal at the bypass line 7 is reduced and the input signal can be supplied to the respective transistors 100a–100e more uniformly, whereby more uniform operation of the transistors 100a–100e is enabled.

Figure 7:
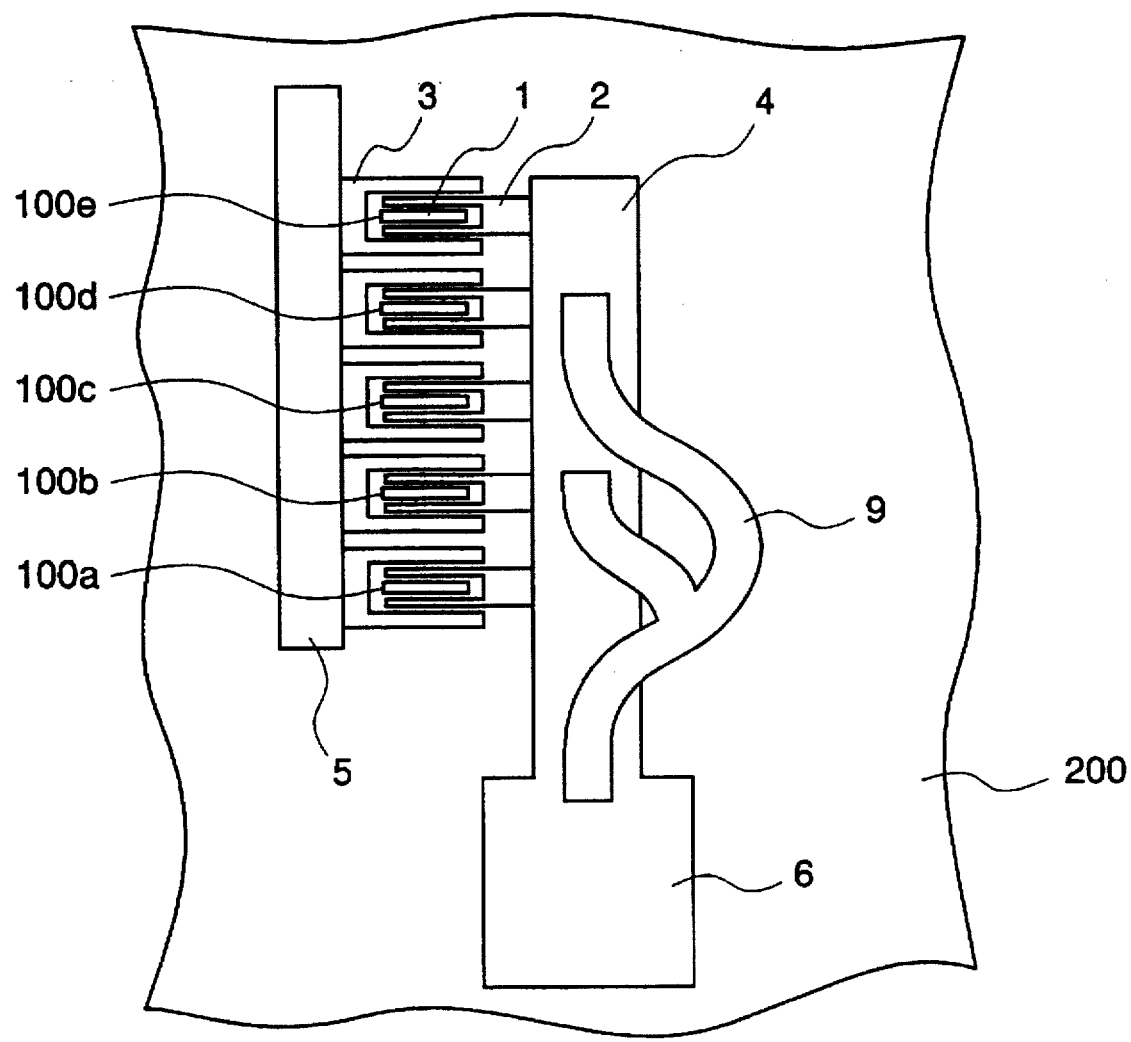
FIG. 7 is a diagram illustrating a fundamental structure of a high power bipolar transistor as a fourth example according to the first embodiment.
Figure 8:
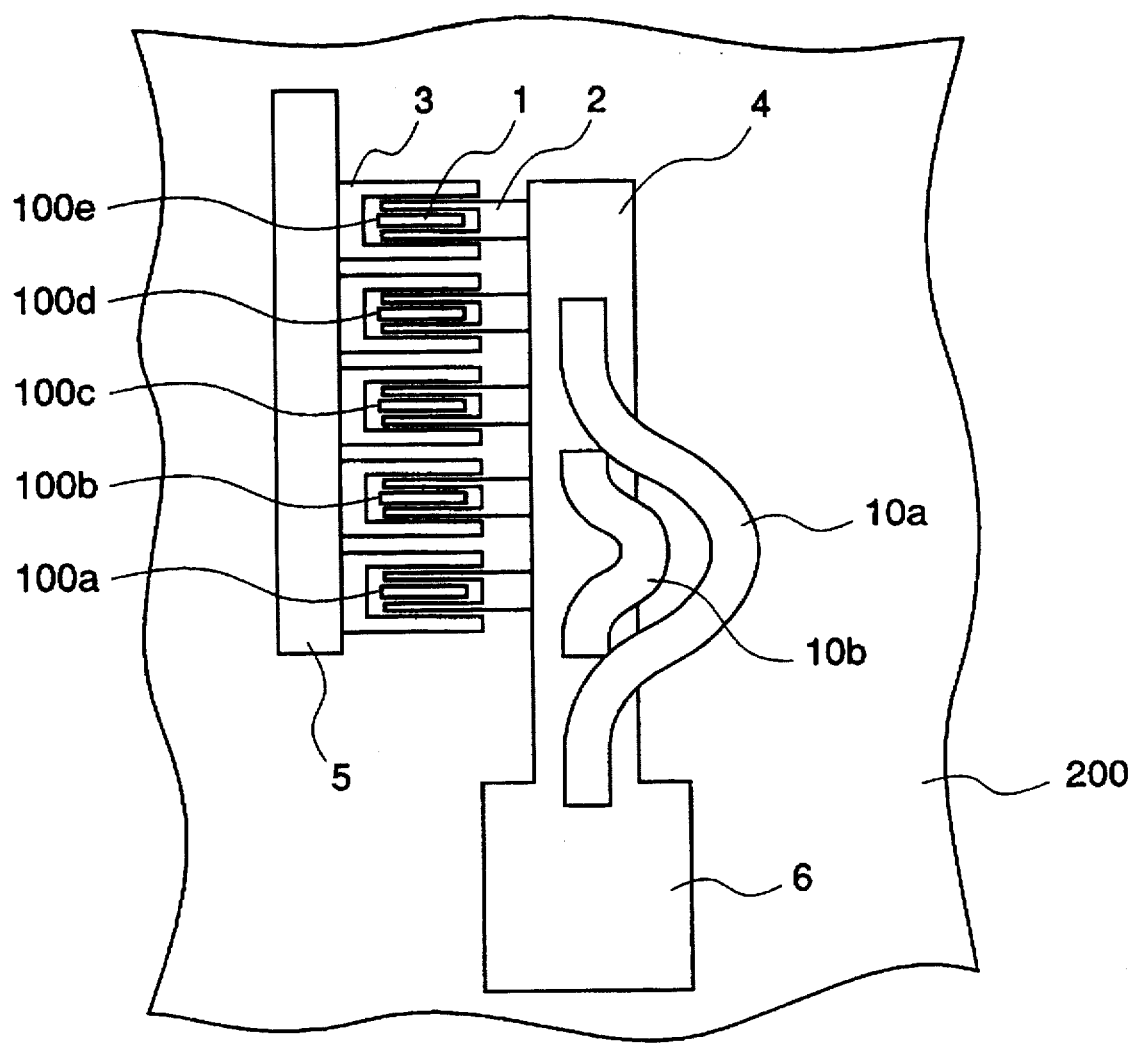
FIG. 8 is a diagram illustrating another fundamental structure of a high power bipolar transistor as the fourth example according to the first embodiment.

FIGS. 7 and 8 illustrate a high power bipolar transistor as a fourth example according to the first embodiment of the present invention shown in FIG. 1. While in the above-described respective examples, the bypass line 7 and the bypass lines 70 and 71 are metal patterns directly on the surface of the substrate, this bypass line may be formed by using an air bridge wiring or a wire in place of the metal pattern. FIG. 7 illustrates a construction in which the structure shown in FIG. 3 is realized by using an air bridge wiring 9 and FIG. 8 is illustrates a construction in which the structure shown in FIG. 5 is realized by using air bridge wirings or wires 10a and 10b.

In the devices in which a metal pattern is disposed on a substrate in the structures of FIGS. 1 and 6, the input signal strays to the earth via the substrate. When a bypass line is constructed in a three-dimensional structure, however, input signal straying from the substrate to the earth can be reduced. In addition, because the bypass line is not formed on the surface of the substrate, the occupying area of the wiring pattern is minimized, whereby plan layout is improved.

Embodiment 2

Figure 9:
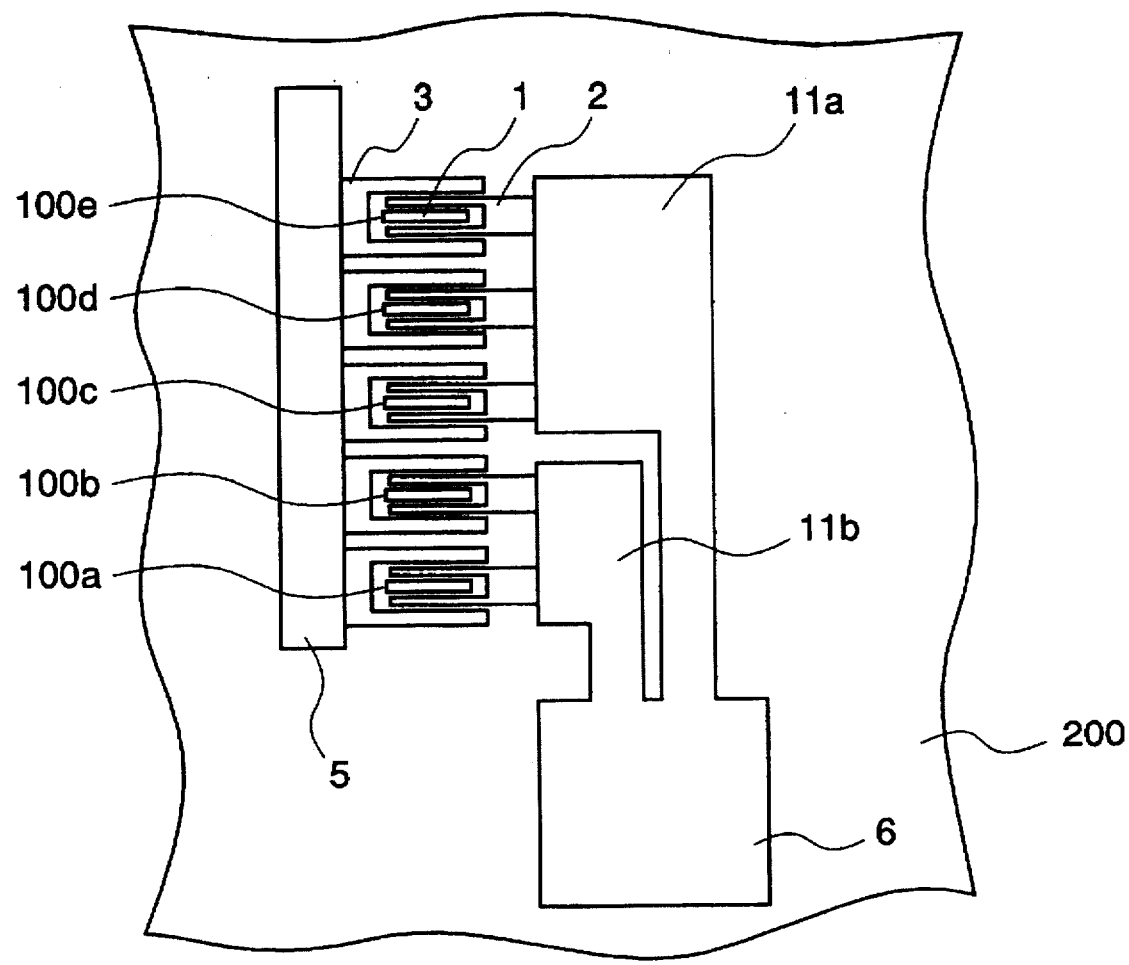
FIG. 9 is a diagram illustrating a fundamental structure of a high power bipolar transistor as a first example according to a second embodiment.

A description is given of a second embodiment of the present invention. FIG. 9 illustrates a construction of an emitter grounded high power bipolar transistor as a first example according to the second embodiment of the present invention. In FIG. 9, emitter wirings are not shown for simplification. As shown in the figure, the emitters 1 of the respective transistors 100a–100e are grounded, and a bias voltage is applied to the collectors (not shown) via the collector feed line 5 and the collector electrodes 3. In addition, the emitters 1 are grounded, electrically connected to the metal layer provided at the rear surface of the substrate 200 via such as a through hole provided in the substrate 200. Reference numeral 6 designates a pad (base input terminal) to which an RF signal is input. Numeral 11a designates a first base feed line connected with the pad 6 and the base electrodes 2 of a first group of three bipolar transistors 100c–100e the end of the first base feed line 11a. Numeral 11b designates a second base feed line connected with the pad 6 and the base electrodes 2 of the second group of two bipolar transistors 100a and 100b at the end of this second base feed line 11b.

A description is given of operation and effect.

As described above, the signals input to the transistors 100a and 100b and the transistors 100c–100e are supplied independently using the independent first and second base feed lines 11b and 11a, respectively, and a signal input from the base input terminal 6 and a bias current are supplied to the first and the second group of transistors via the first and second base feed lines 11a and 11b, respectively, and then, the signals amplified by the respective transistors are output from the collector electrode 3 and the collector feed line 5, respectively. Since during this operation the input signal is supplied to the groups of the transistors via the independent base feed lines 11a and 11b branched from the input terminal 6, the difference between the input signals which are respectively supplied to the group of transistors (transistors 100a and 100b) disposed at positions close to the base input terminal 6 and the group of transistors (transistors 100c–100e) disposed at positions far from the base input terminal 6 is made small, thereby resulting in uniform transistor operation for both transistor groups.

Figure 10:
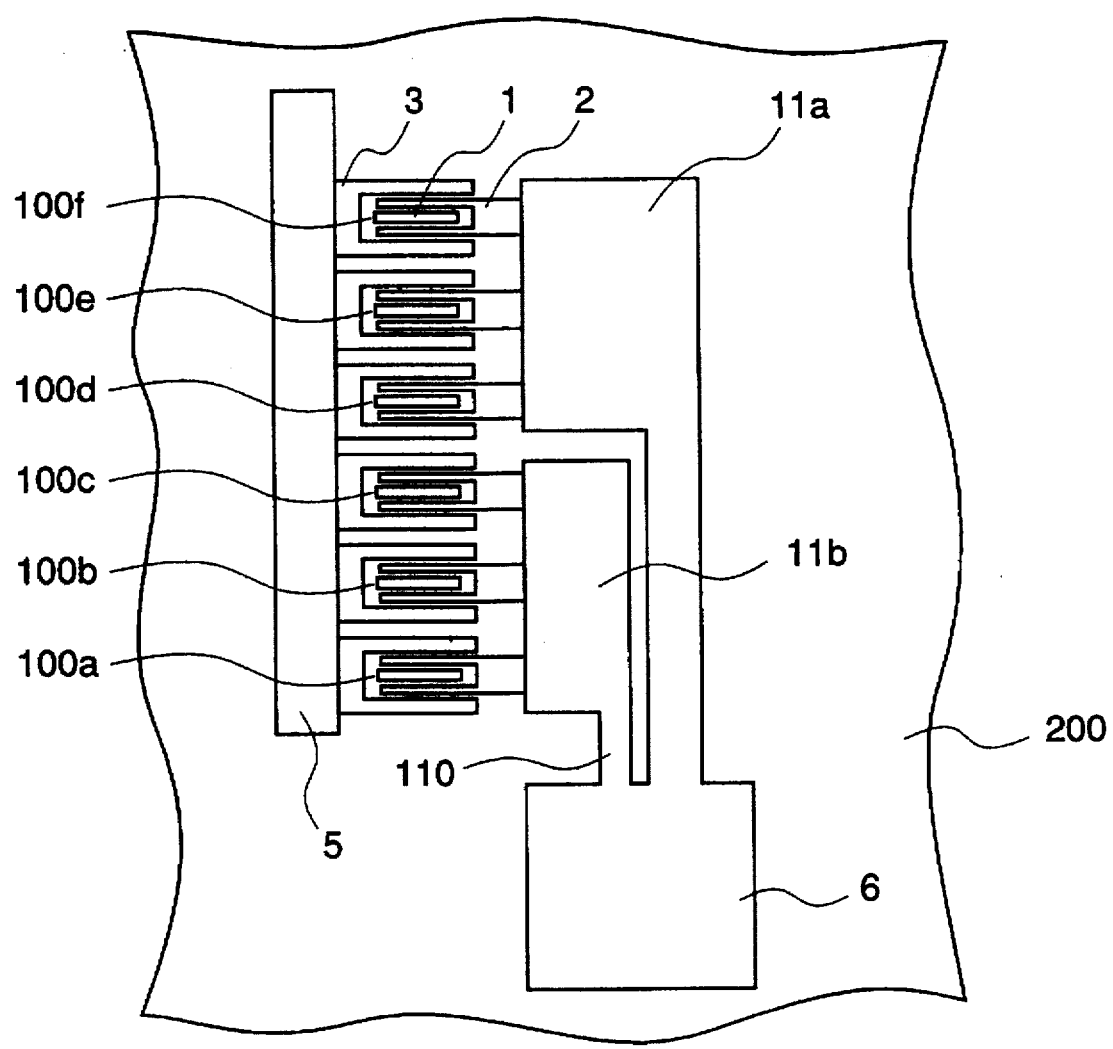
FIG. 10 is a diagram illustrating a fundamental structure of a high power bipolar transistor as a second example according to the second embodiment.

FIG. 10 illustrates a high power bipolar transistor as a second example according to the second embodiment shown in FIG. 9. As shown in the figure, the second base feed line 11b has a finer width for the connecting portion 110 in the vicinity of the base electrode terminal 6 than the first feed line 11a.

By providing such a construction, the difference between the input signal supplied to the transistors disposed at positions close to the base input terminal 6 and the input signal supplied to the transistors disposed at a position far from the base input terminal 6 is minimized, and the transistor operations of the both transistor groups are made uniform. In addition, the resistances viewed from the base input terminal 6 to the respective transistor groups are made equal, whereby uniform input signals are supplied to the respective transistor groups, providing uniformity of the operations of those transistors.

Figure 11:
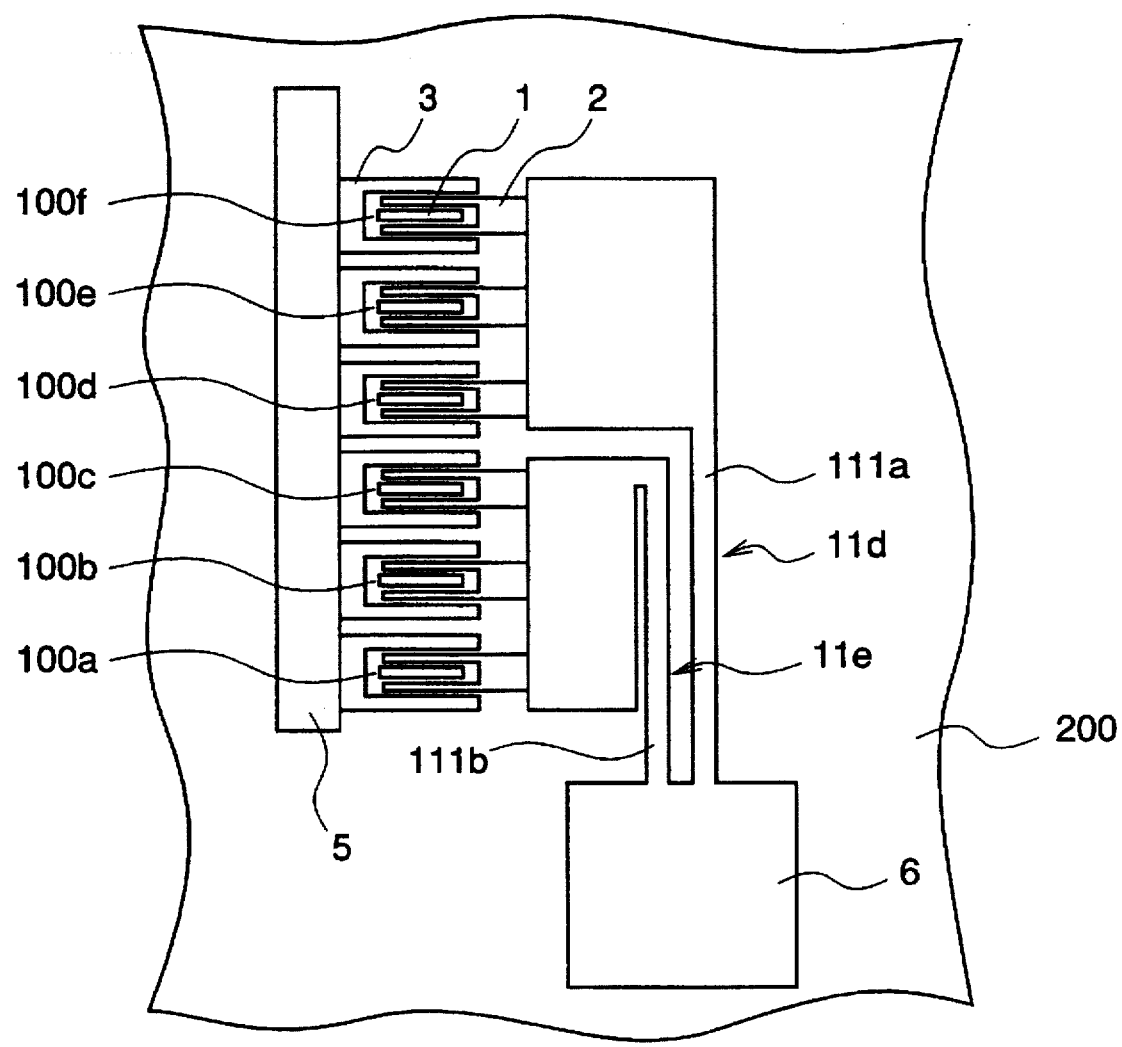
FIG. 11 is a diagram illustrating a fundamental structure of a high power bipolar transistor as a third example according to the second embodiment.

FIG. 11 illustrates a high power bipolar transistor as a third example according to the second embodiment of the present invention shown in FIG. 9. As shown in FIG. 9, the connecting portions 111a and 111b in the vicinity of the base electrode terminal 6 of the first base feed line 11d and the second base feed line 11e both branching from the base input terminal 6 have equal wiring distances.

By adopting such a construction, the distance between the input signal supplied to the transistors disposed close to the base input terminal 6 and the input signal supplied to the transistors disposed far from the base input terminal 6 is minimized, whereby the transistor operations of the respective transistor groups are made uniform. In addition, the line lengths for the RF signals input from the base electrode terminal 6 transmitted to the respective transistors are made equal to each other and thereby the phases of the input signals supplied to the respective transistor groups are made equal, thereby improving the transistor output power and efficiency.

In the transistor circuits having constructions shown in FIGS. 9, 10, and 11, when the sums of the emitter areas of the transistors in the respective groups are equal, the demand and supply of the input signals to the respective transistor groups are equal in the respective groups, whereby more uniform operation is possible. In this case, if the sums of the emitter areas of the transistors in the respective groups are equal, the emitter areas of the respective transistors in each group can be variable. Furthermore, when the number of the transistors in the respective groups (three transistors 100a–100c and three transistors 100d–100f form groups, respectively), and the structures and the sizes of the transistors are equal to each other as shown in FIGS. 10 and 11, the demand and supply of the input signals to the respective transistors are equal for respective groups, thereby resulting in uniform transistor operations among the groups.

Figure 12:
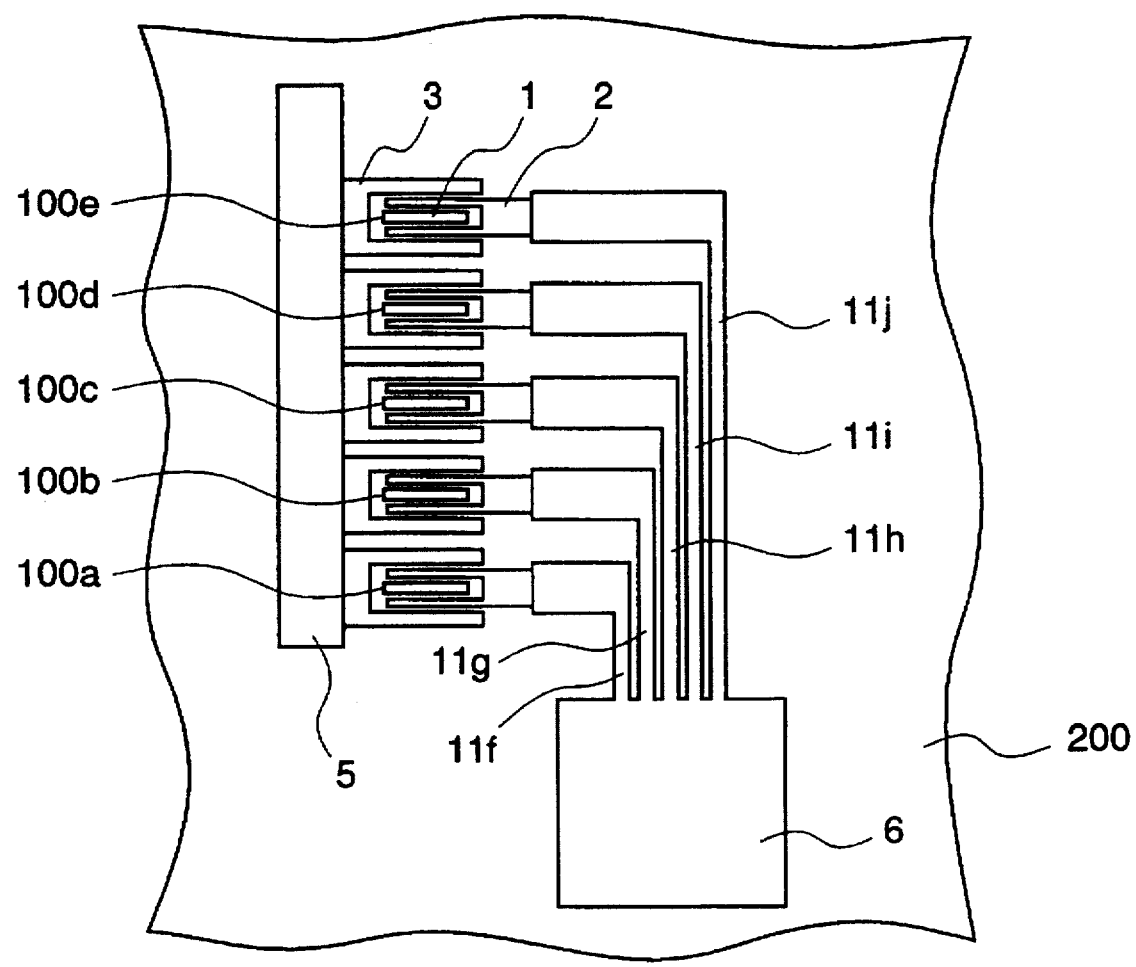
FIG. 12 is a diagram illustrating a fundamental structure of a high power bipolar transistor as a fourth example according to the second embodiment.

FIG. 12 illustrates a construction of an emitter grounded high power transistor as a fourth example according to the second embodiment of the present invention. As shown in the figure, independent base feed lines 11f–11j are provided for the respective transistors 100a–100e from the base input terminal 6.

By providing such a construction, relative to the construction of FIG. 9 in which a base feed line is provided for a group comprising three transistors and groups comprising two transistors, the input signals supplied to the respective transistors 100a–100e become uniform, whereby more uniform transistor operations than that of FIG. 9 is enabled.

Figure 13:
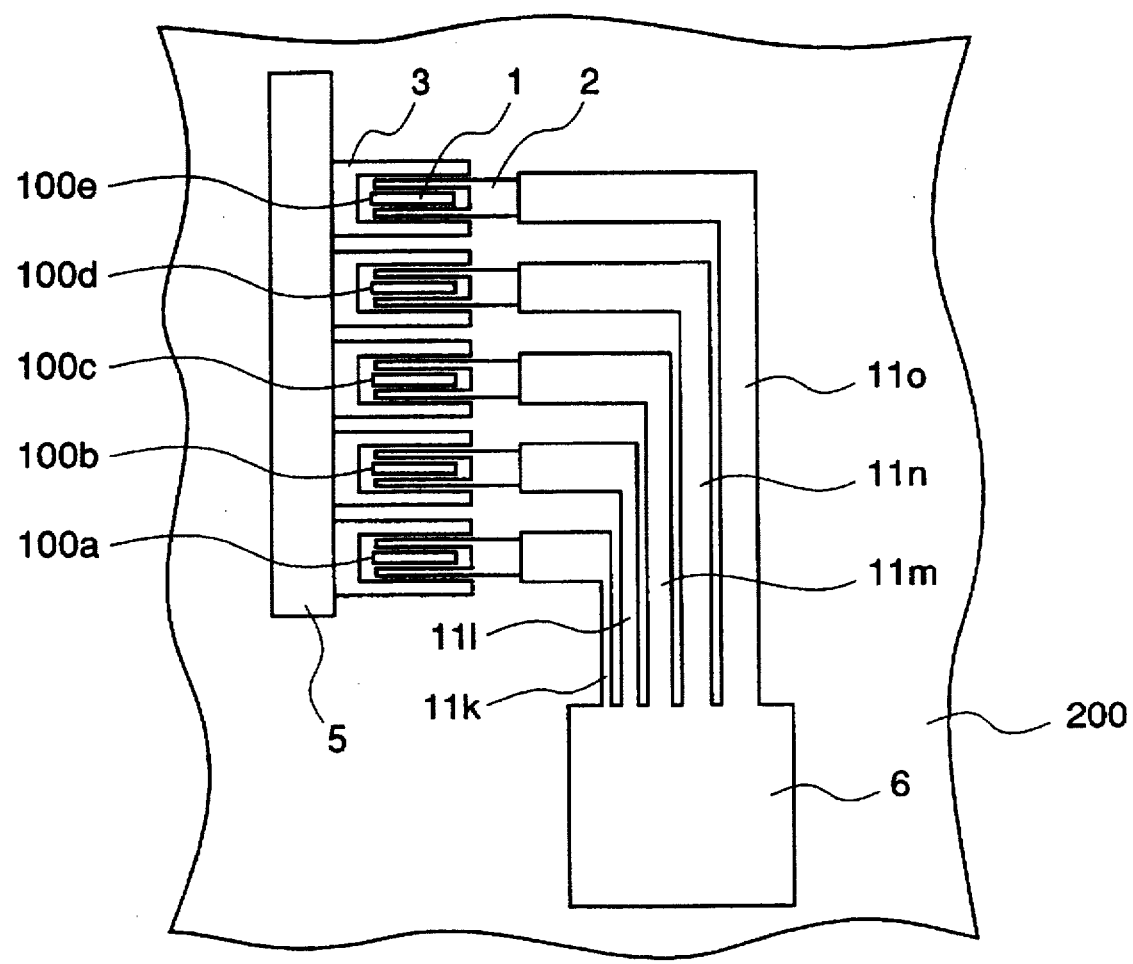
FIG. 13 is a diagram illustrating a fundamental structure of a high power bipolar transistor as a fifth example according to the second embodiment.

FIG. 13 shows a construction of an emitter grounded high power bipolar transistor as a fifth example according to the second embodiment of the present invention shown in FIG. 9. As shown in the figure, the base feed lines 11k–11n are formed independently for respective transistors 100a–100e and the line widths of the respective base feed lines 11k–11o are made narrower for the transistors closer to the input terminal 6 because the lengths of the base feed lines for the transistors as closer to the input terminal 6 are shorter and the line widths of the base feed lines are made farther for the transistors farther from the base input terminal 6 because the lengths of the base feed lines for the transistors farther from the base input terminal 6 are longer.

By providing such a construction, approximately equal powers are supplied to the transistors 100a–100e connected to respective positions of the base feed lines 11k–11o, whereby the operation of the respective transistors 100a–100e is made uniform and the output power and efficiency of the device are improved. In addition, the resistances from the base input terminal 6 to the respective transistors 100a–100e viewed from the input terminal 6 are made equal, whereby the input signals supplied to the respective transistors are made uniform and transistor operation can be made more uniform than that shown in FIG. 12.

Figure 14:
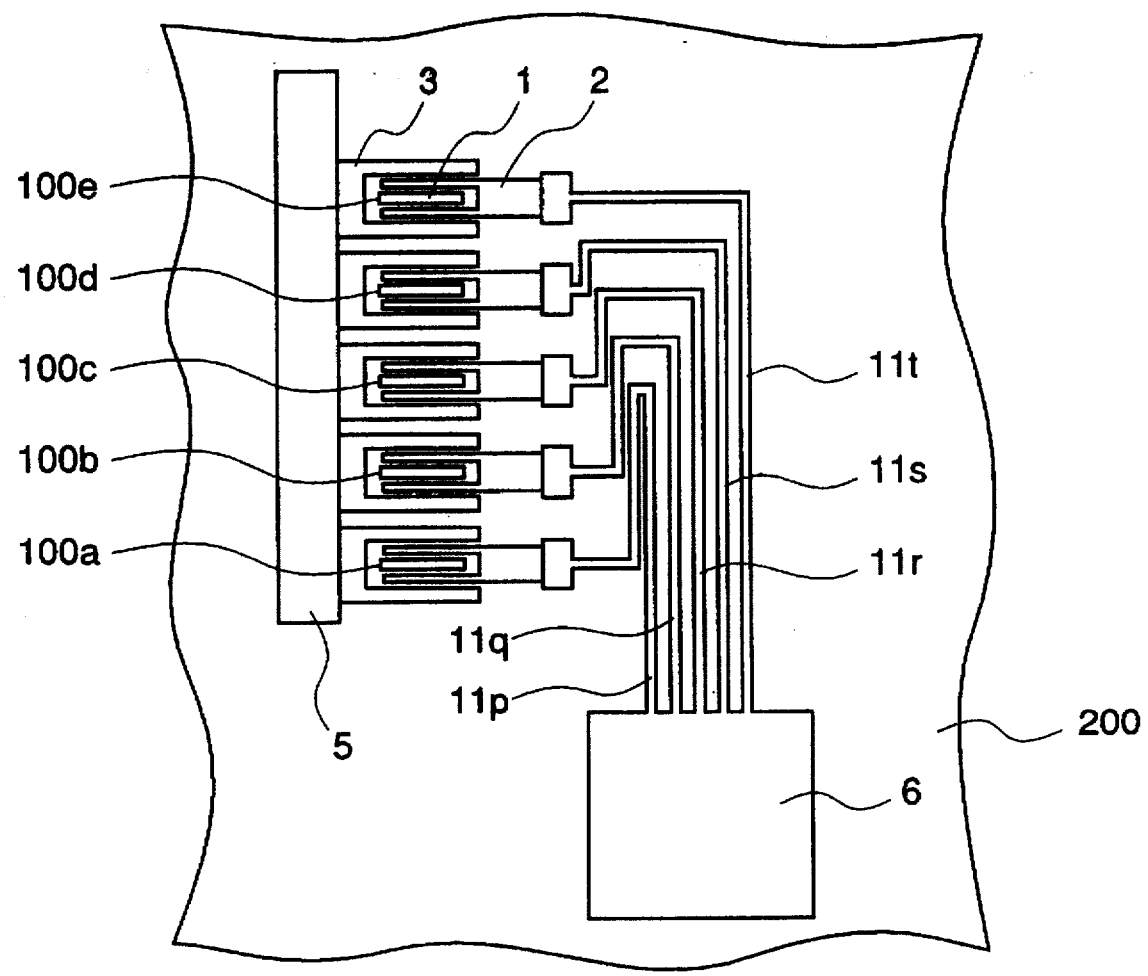
FIG. 14 is a diagram illustrating a fundamental structure of a high power bipolar transistor as a sixth example according to the second embodiment.
Figure 15:
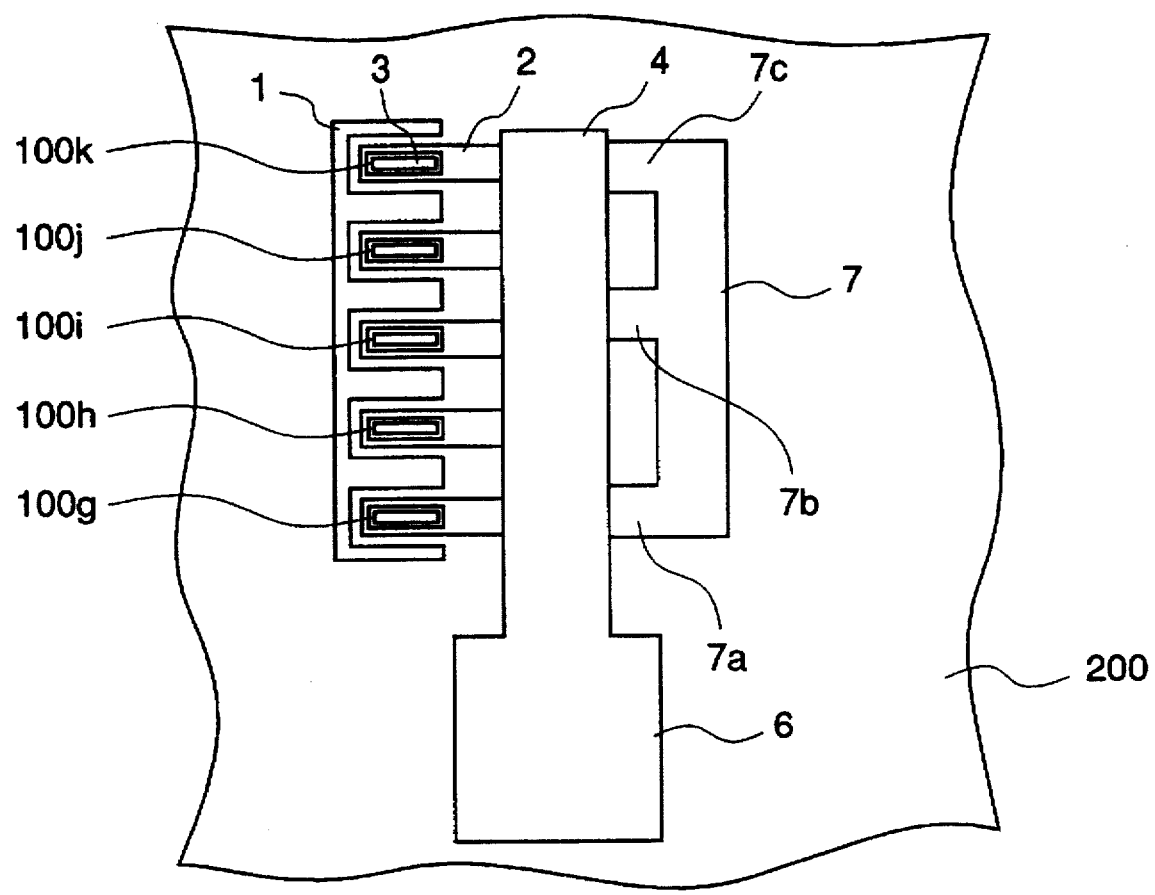
FIG. 15 is a diagram illustrating a fundamental structure of a high power bipolar transistor according to the third embodiment of the present invention, which comprises the high power bipolar transistor shown as the third example of the first embodiment shown in FIG. 1, employing a transistor having an emitter at the periphery of a collector.
Figure 16:
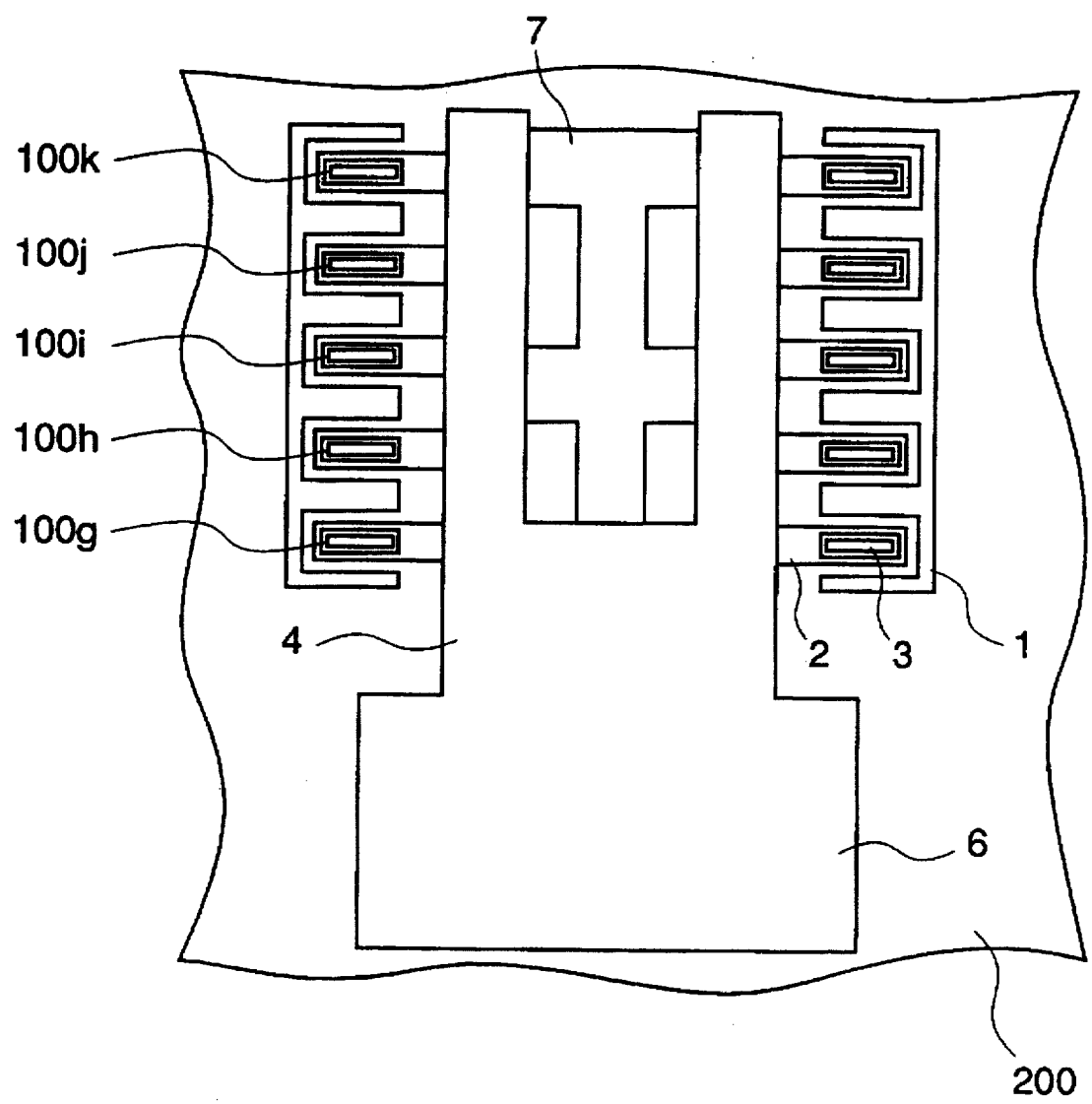
FIG. 16 is a diagram illustrating a layout pattern when the high power bipolar transistor of the third embodiment shown in FIG. 15 is applied to an actual circuit.
Figure 17:
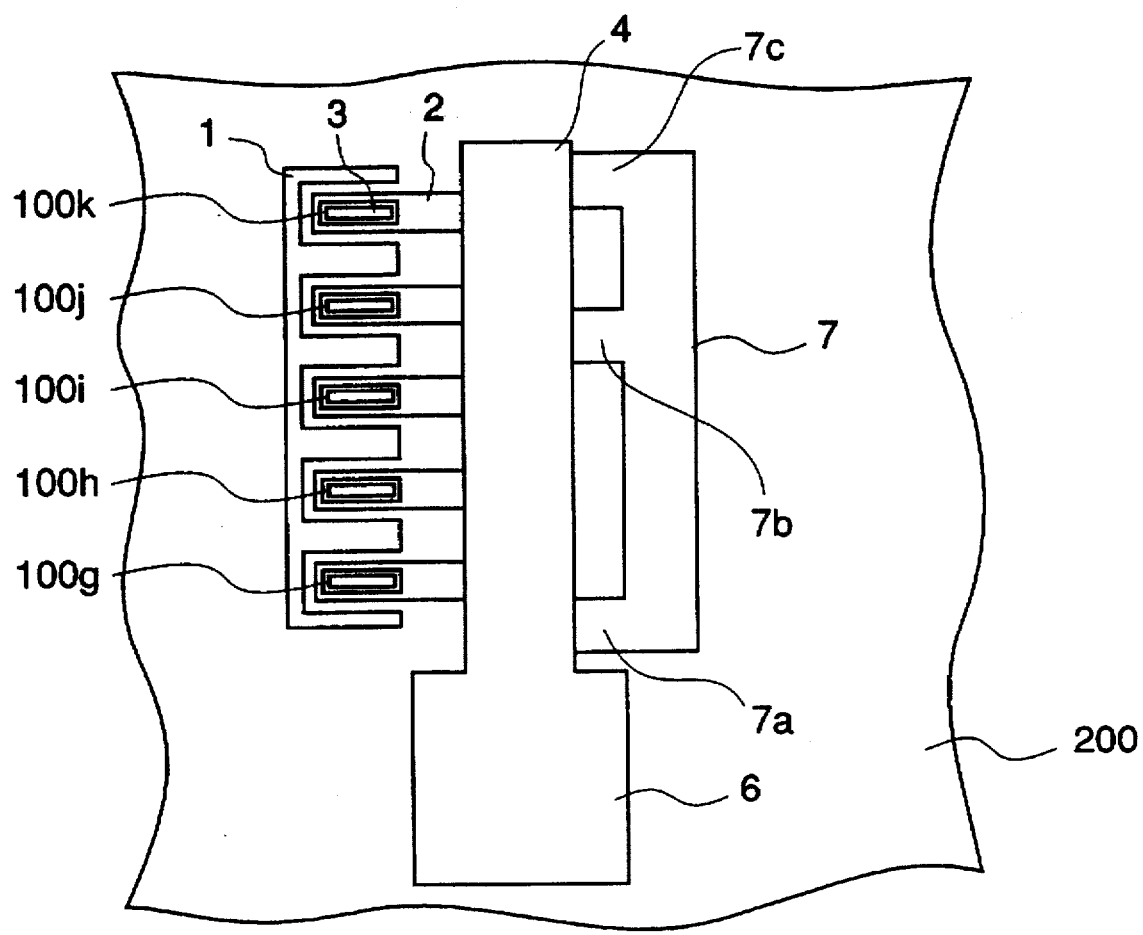
FIG. 17 is a diagram illustrating a fundamental structure of a high power bipolar transistor according to the third embodiment of the present invention, which comprises the high power bipolar transistor shown as the second example of the first embodiment shown in FIG. 3, employing a transistor having an emitter at the periphery of a collector.
Figure 18:
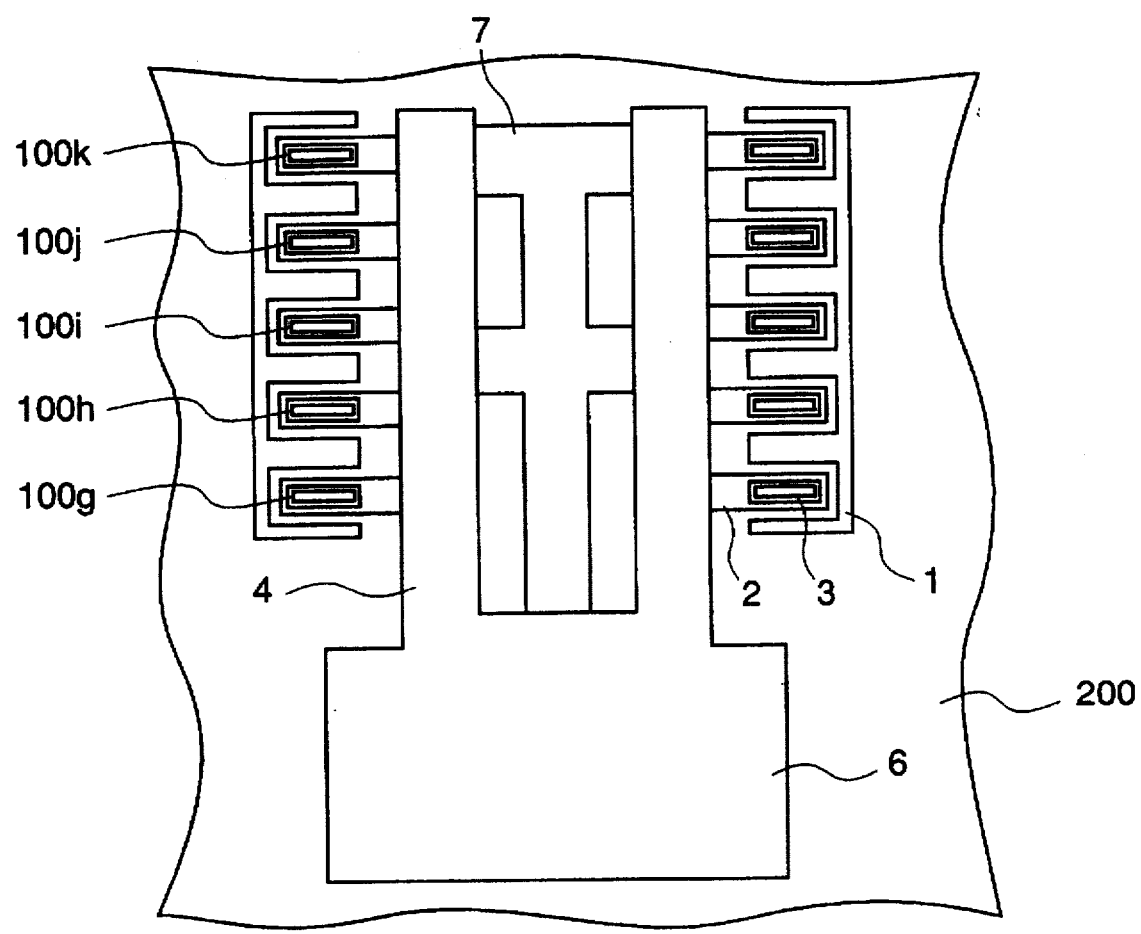
FIG. 18 is a diagram illustrating a layout pattern when the high power bipolar transistor of the third embodiment shown in FIG. 17 is applied to an actual circuit.
Figure 19:
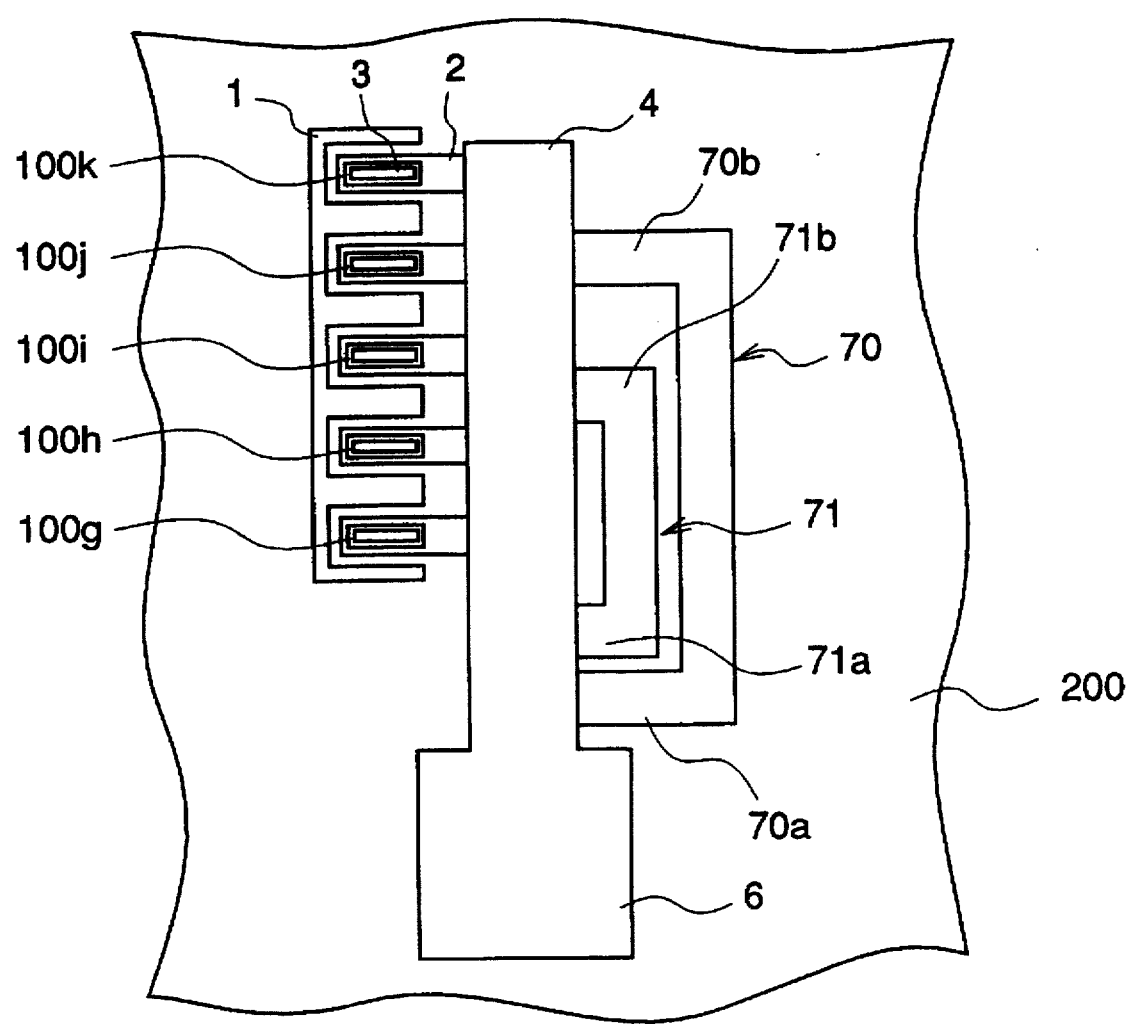
FIG. 19 is a diagram illustrating a fundamental structure of a high power bipolar transistor according to the third embodiment of the present invention, which comprises the high power bipolar transistor shown as the third example of the first embodiment shown in FIG. 5, employing a transistor having an emitter at the periphery of a collector.
Figure 20:
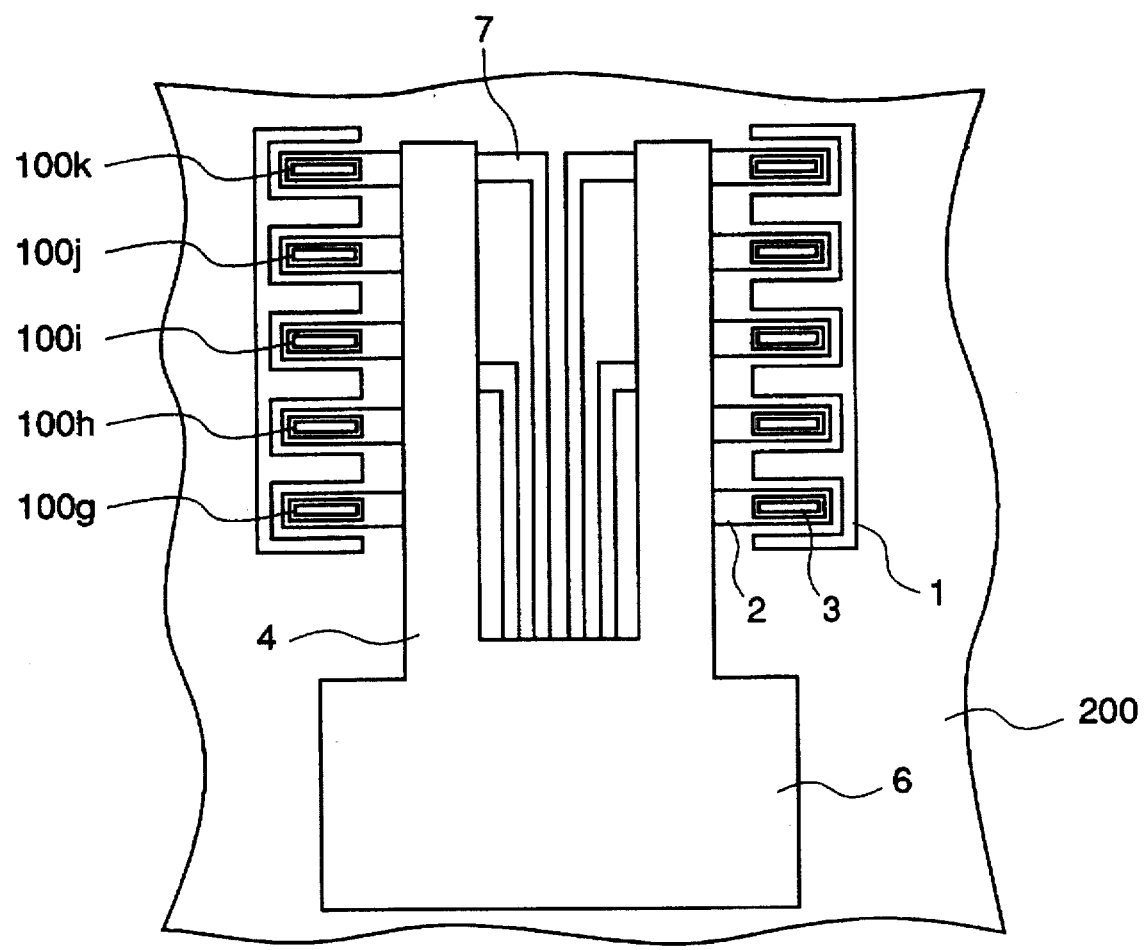
FIG. 20 is a diagram illustrating a layout when the high power bipolar transistor of the third embodiment shown in FIG. 19 is applied to an actual circuit.
Figure 21:
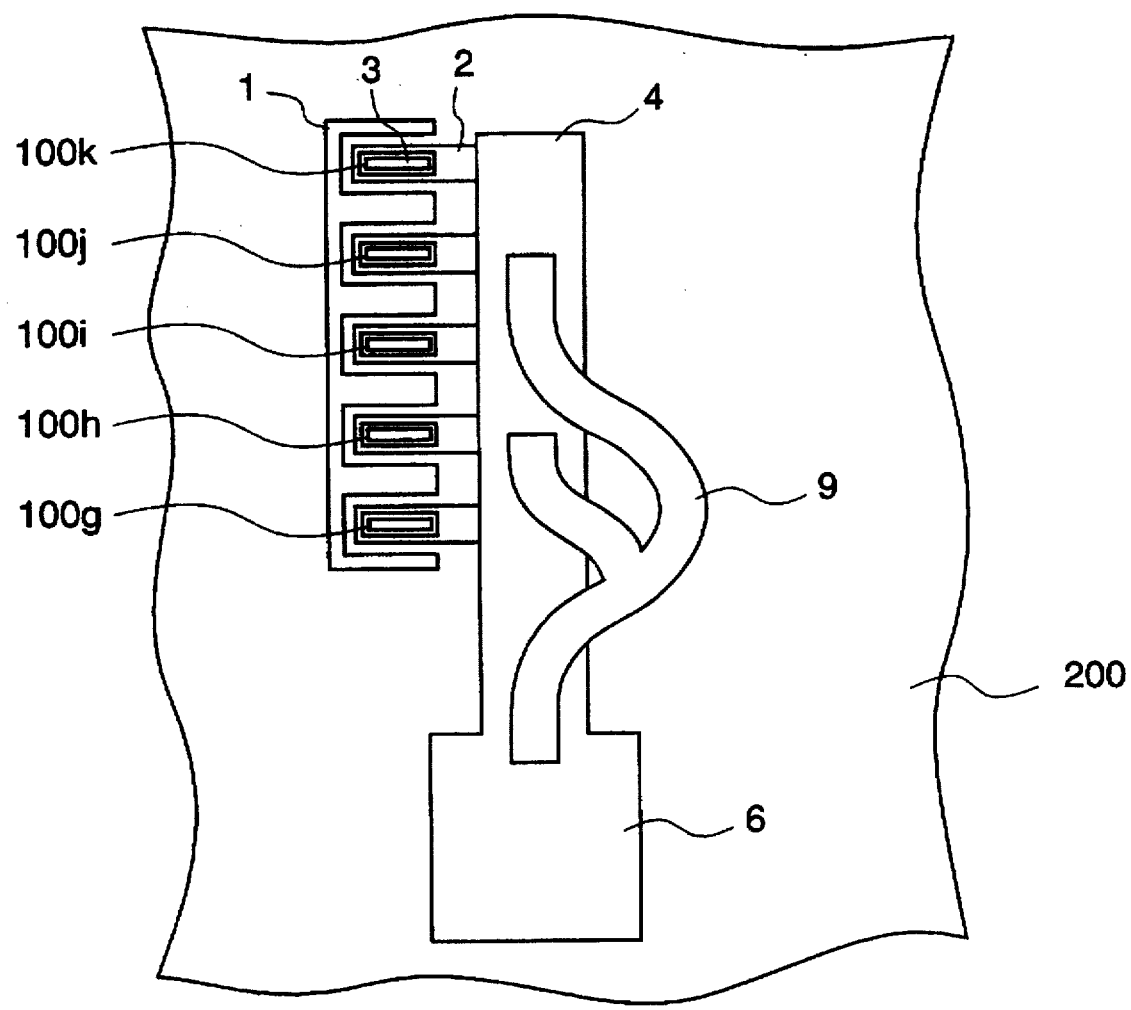
FIG. 21 is a diagram illustrating a fundamental structure of a high power bipolar transistor according to the third embodiment of the present invention, which comprises the high power bipolar transistor shown as the fourth example of the first embodiment shown in FIG. 7, employing a transistor having an emitter at the periphery of a collector.
Figure 22:
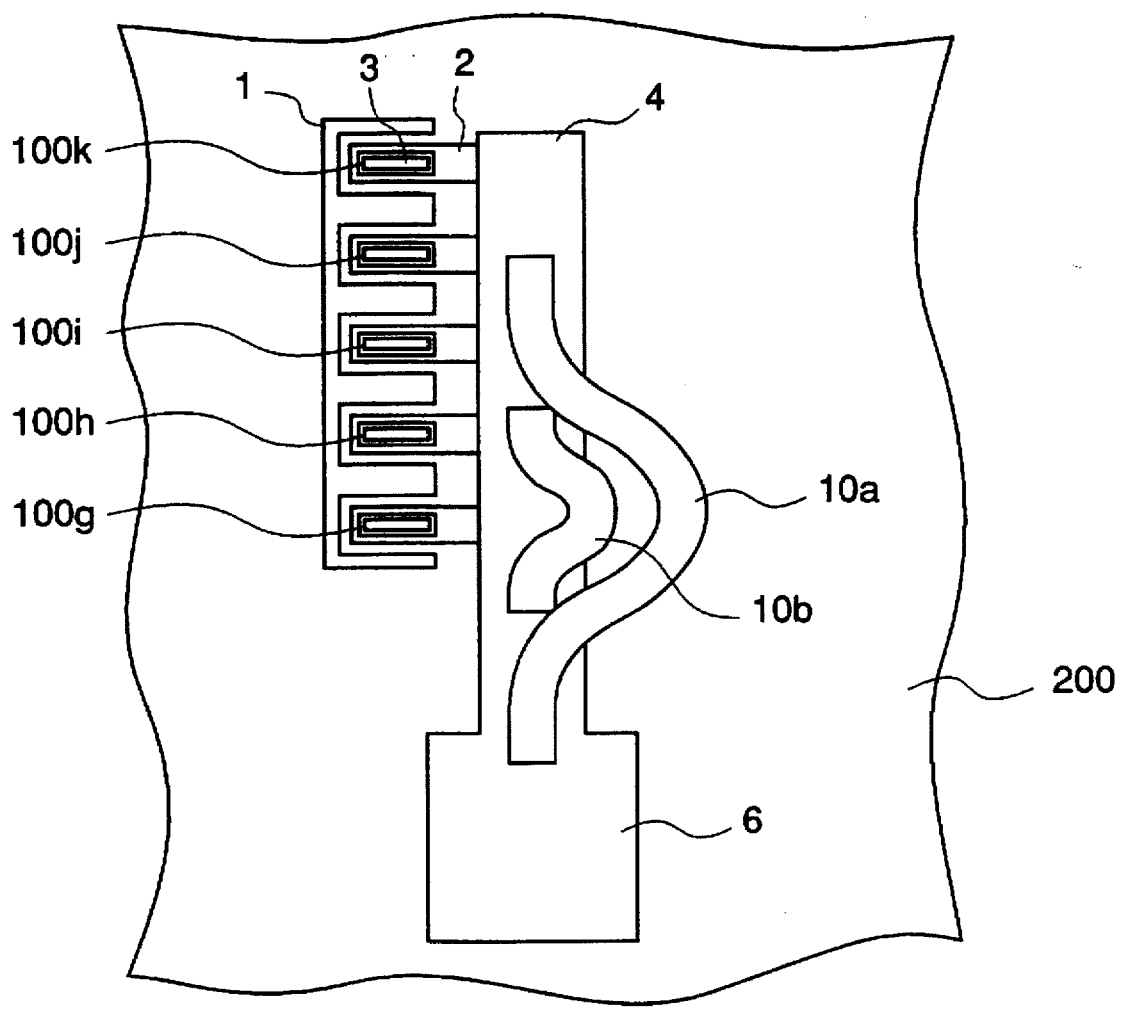
FIG. 22 is a diagram illustrating a fundamental structure of a high power bipolar transistor according to the third embodiment of the present invention, which comprises the high power bipolar transistor shown as the fourth example of the first embodiment shown in FIG. 8, employing a transistor having an emitter at the periphery of a collector.
Figure 23:
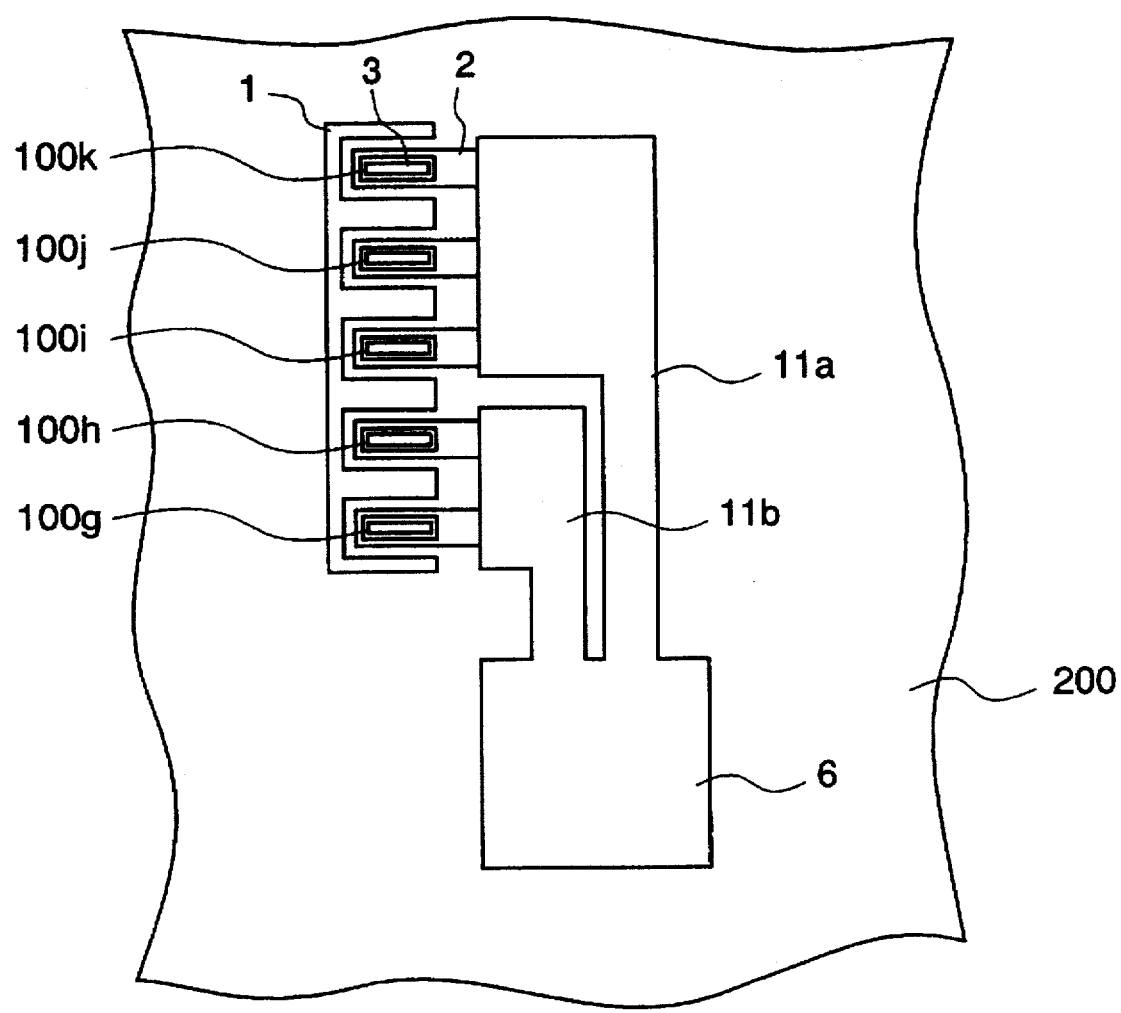
FIG. 23 is a diagram illustrating a fundamental structure of a high power bipolar transistor according to the third embodiment of the present invention, which comprises the high power bipolar transistor shown as the first example of the second embodiment shown in FIG. 9, employing a transistor having an emitter at the periphery of a collector.
Figure 24:
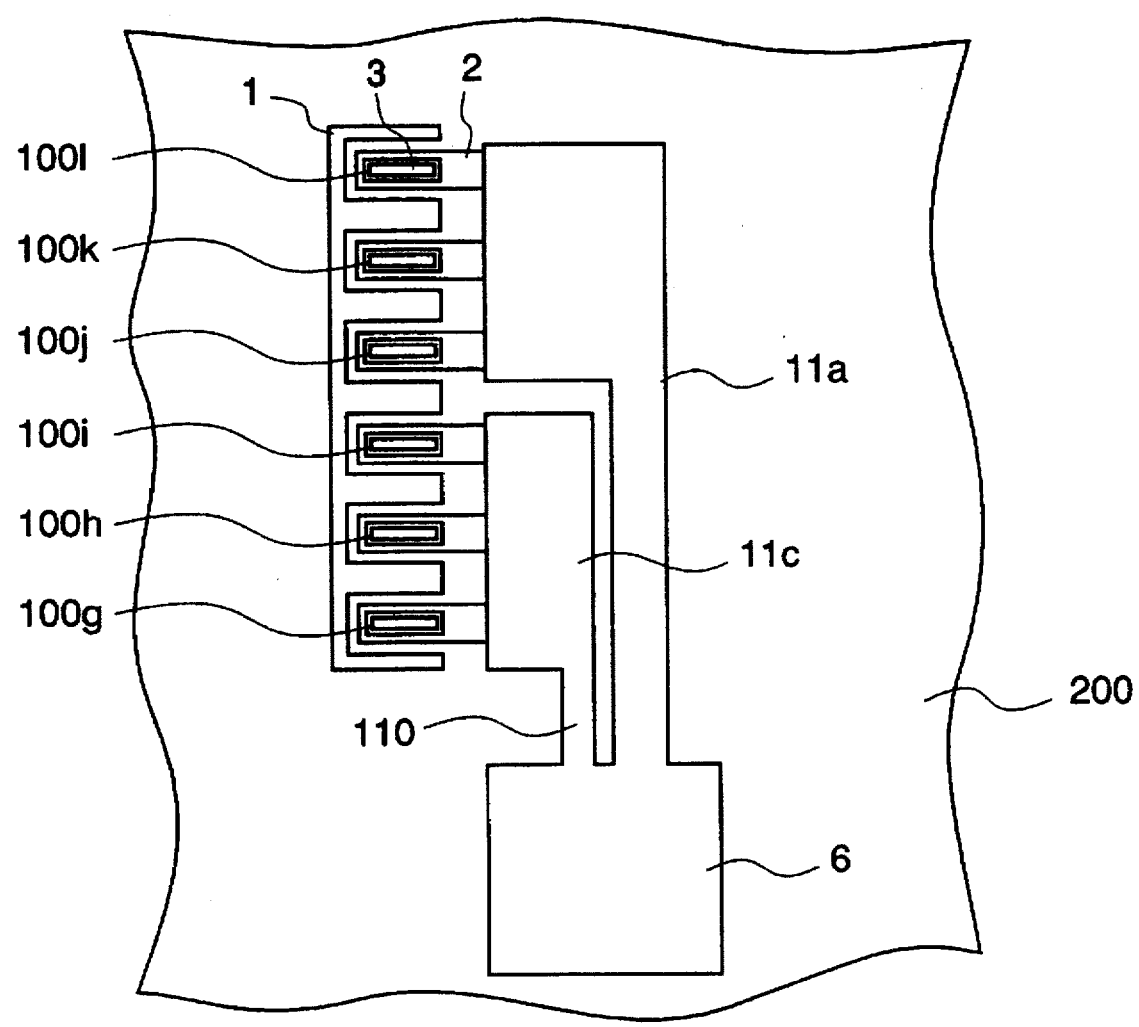
FIG. 24 is a diagram illustrating a fundamental structure of a high power bipolar transistor according to the third embodiment of the present invention, which comprises the high power bipolar transistor shown as the second example of the second embodiment shown in FIG. 10, employing a transistor having an emitter at the periphery of a collector.
Figure 25:
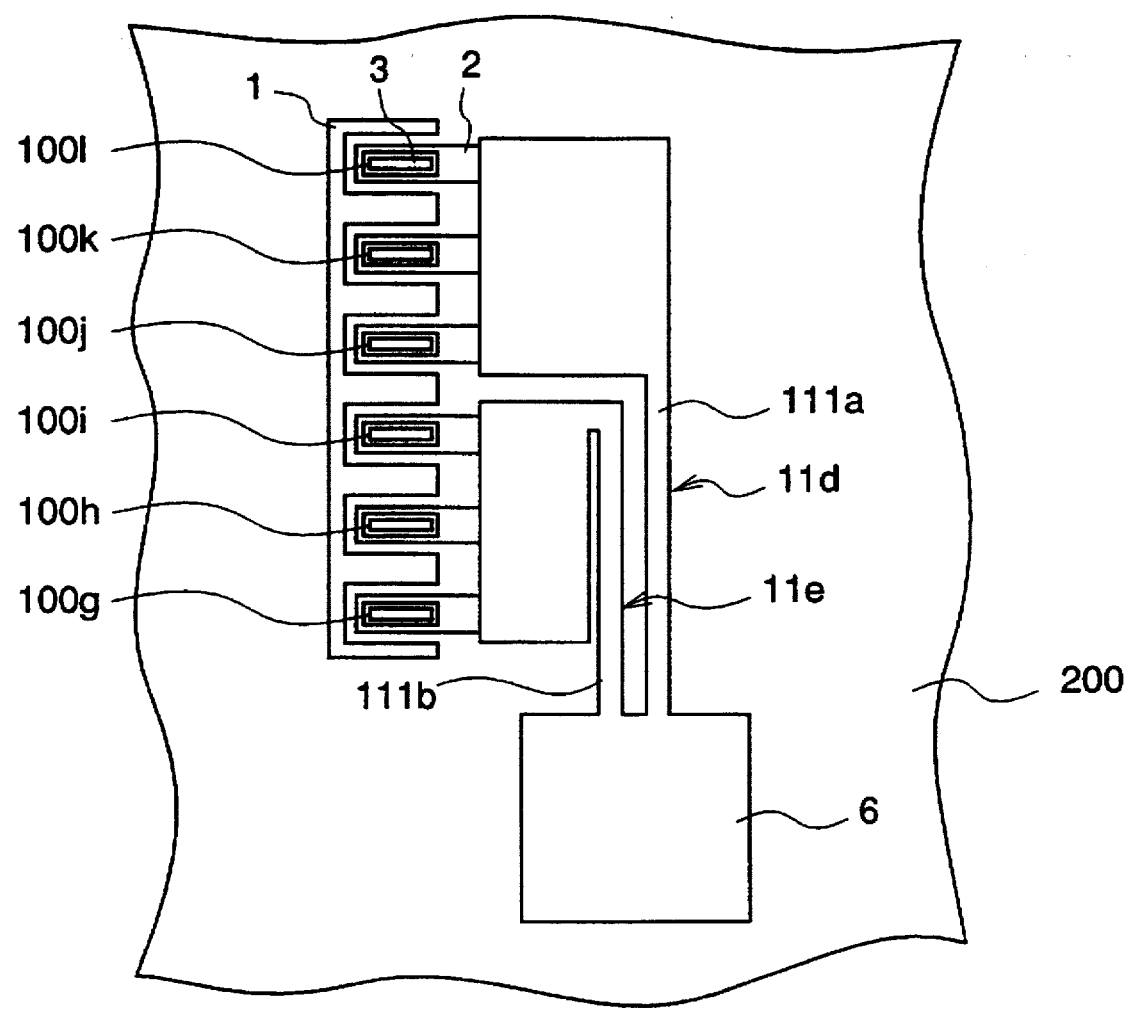
FIG. 25 is a diagram illustrating a fundamental structure of a high power bipolar transistor according to the third embodiment of the present invention, which comprises the high power bipolar transistor shown as the third example of the second embodiment shown in FIG. 11, employing a transistor having an emitter at the periphery of a collector.
Figure 26:
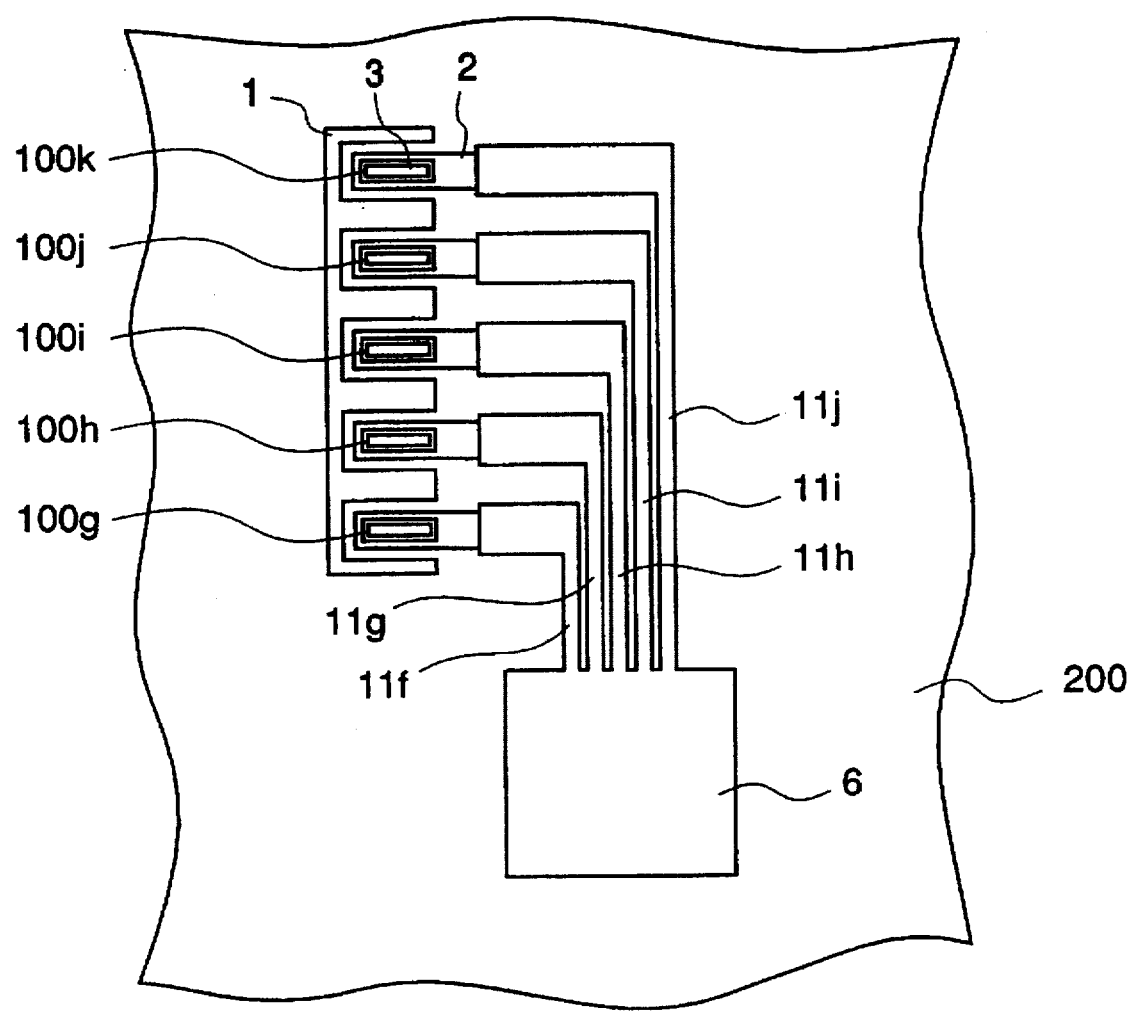
FIG. 26 is a diagram illustrating a fundamental structure of a high power bipolar transistor according to the third embodiment of the present invention, which comprises the high power bipolar transistor shown as the fourth example of the second embodiment shown in FIG. 12, employing a transistor having an emitter at the periphery of a collector.
Figure 27:
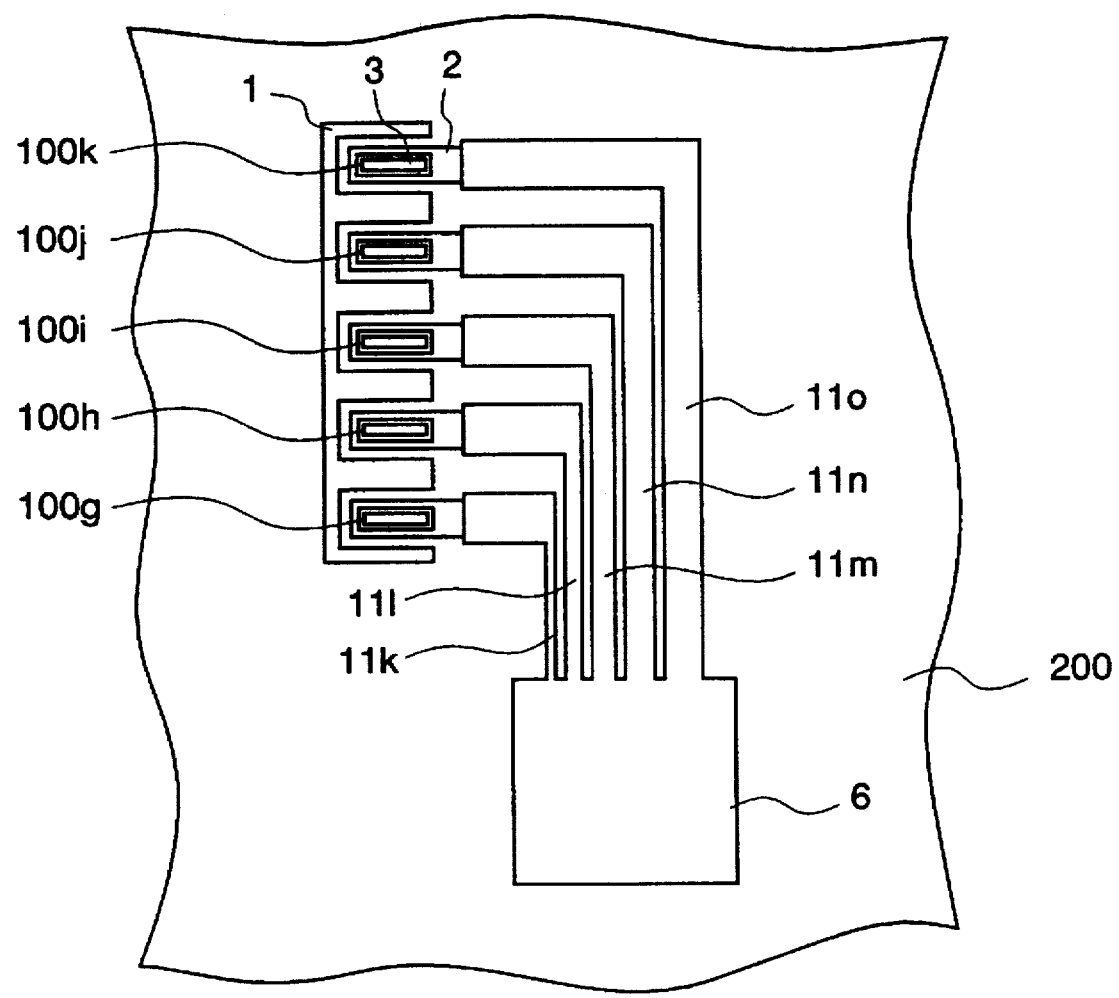
FIG. 27 is a diagram illustrating a fundamental structure of a high power bipolar transistor according to the third embodiment of the present invention, which comprises the high power bipolar transistor shown as the second example of the fifth embodiment shown in FIG. 13, employing a transistor having an emitter at the periphery of a collector.
Figure 28:
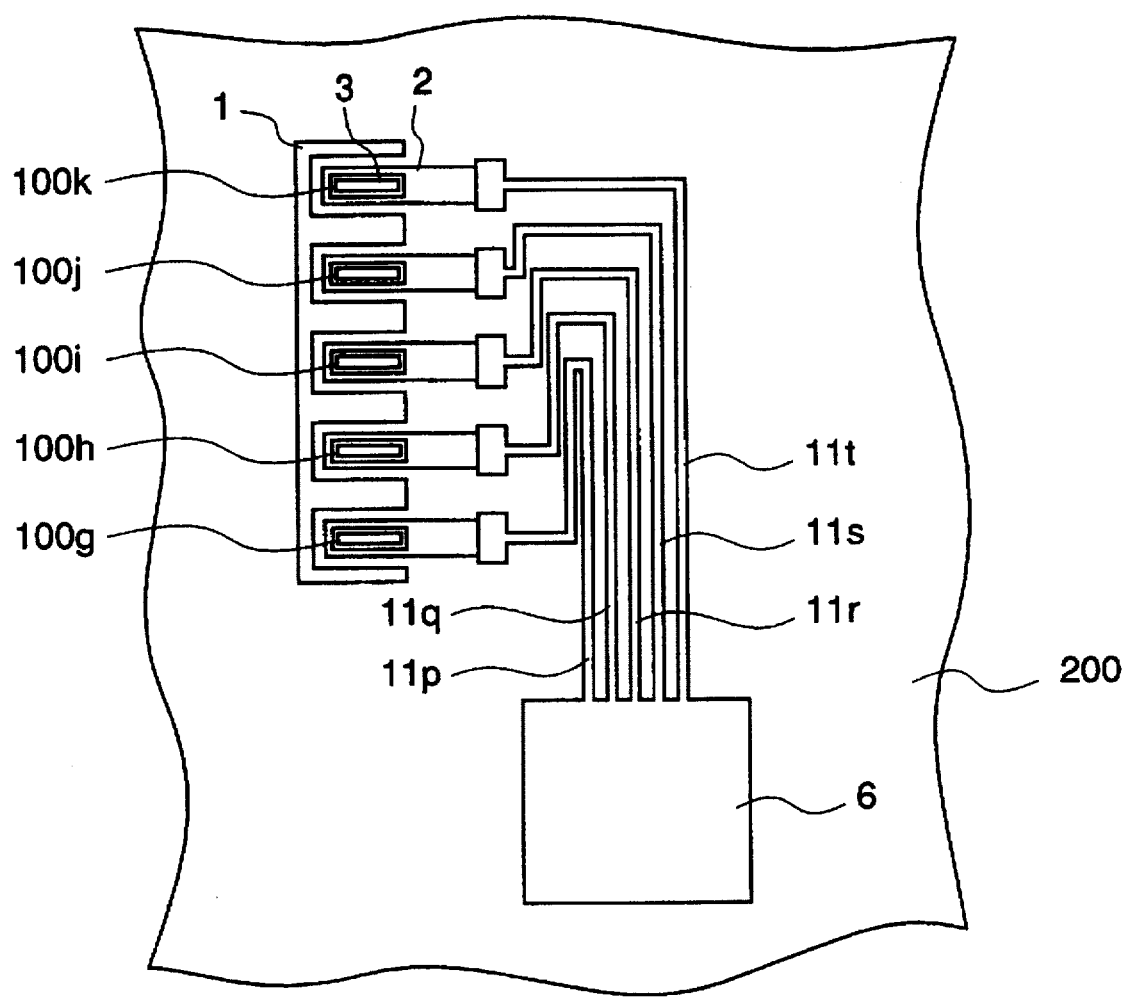
FIG. 28 is a diagram illustrating a fundamental structure of a high power bipolar transistor according to the third embodiment of the present invention, which comprises the high power bipolar transistor shown as the sixth example of the second embodiment shown in FIG. 14, employing a transistor having an emitter at the periphery of a collector.

FIG. 14 illustrates an emitter grounded type high power bipolar transistor as a sixth example according to the second embodiment shown in FIG. 14. As shown in the figure, the base feed lines 11k–11n are formed independently for the respective transistors 100a–100e , and the wiring lengths of the respective feed lines 11k–11n up to the respective transistors 100a–100e are made equal to each other.

By providing such a construction, approximately equal powers are supplied to the transistors 100a–100e which are connected to respective base feed lines 11k–11o, and the operations of the respective transistors 100a–100e are made uniform, whereby the output power and the efficiency of the device are made uniform. Thereby, the output power and the efficiency of transistors are improved.

In the transistor circuit having a construction shown in FIGS. 13 and 14, the emitter areas of the transistors of the respective transistors 100a–100e are equal to each other, whereby the demand and supply of the input signal power to the respective transistors 100a–100e are equal to each other. Therefore, more uniform transistor operations are enabled. Further, all the transistors 100a–100e have the same structures and the same sizes and, therefore, the demand and supply of the input signal in the respective transistors 100a–100e are equal to each other. Therefore, more uniform transistor operations are enabled.

Embodiment 3

A description is given of a third embodiment of the present invention. FIGS. 15, 17, 19, and 21–28 illustrate an emitter grounded type high power bipolar transistor according to an example of the third embodiment of the present invention.

Figure 29:
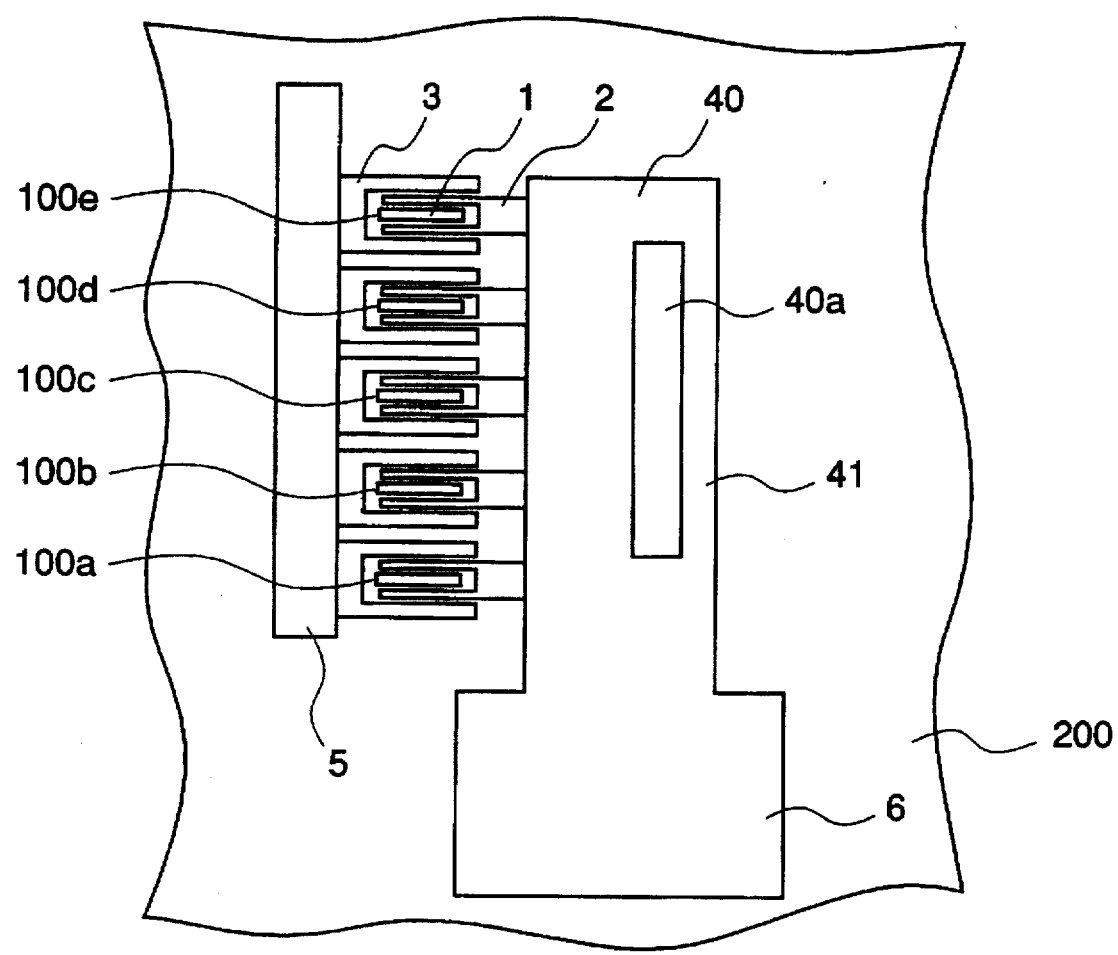
FIG. 29 is a diagram illustrating a fundamental structure of a high power bipolar transistor as a first example according to a fourth embodiment of the present invention.

In the first embodiment and the second embodiment, as the respective emitter grounded high power bipolar transistors, a transistor having a collector at the periphery of an emitter is employed. However, in place of the bipolar transistors shown in FIGS. 1, 3, 5, and 7–14. In FIGS. 15, 17, 19, and 21–28 bipolar transistors 100g–100k each have a structure in which an emitter is disposed at the periphery of a collector as shown in FIG. 29.

Embodiment 4

A description is given of a fourth embodiment of the present invention. In the first and second examples of the first embodiment, a bypass line connected to the base feed line is provided in addition to the base feed line. In this fourth embodiment, as shown in FIG. 29, a base feed line 40 having a relatively wide width is employed, an aperture 40a is formed therein, and the base feed line region separated by the aperture 40a is used as a bypass line 41.

By providing such a construction, approximately equal powers are supplied to the transistors 100a–100e which are connected to respective positions of the base feed lines 40 whereby the operation of the respective transistors 100a–100e is made uniform. This results in improvement in the output power and efficiency of the device and elimination of the process for forming wiring patterns.

Figure 30:
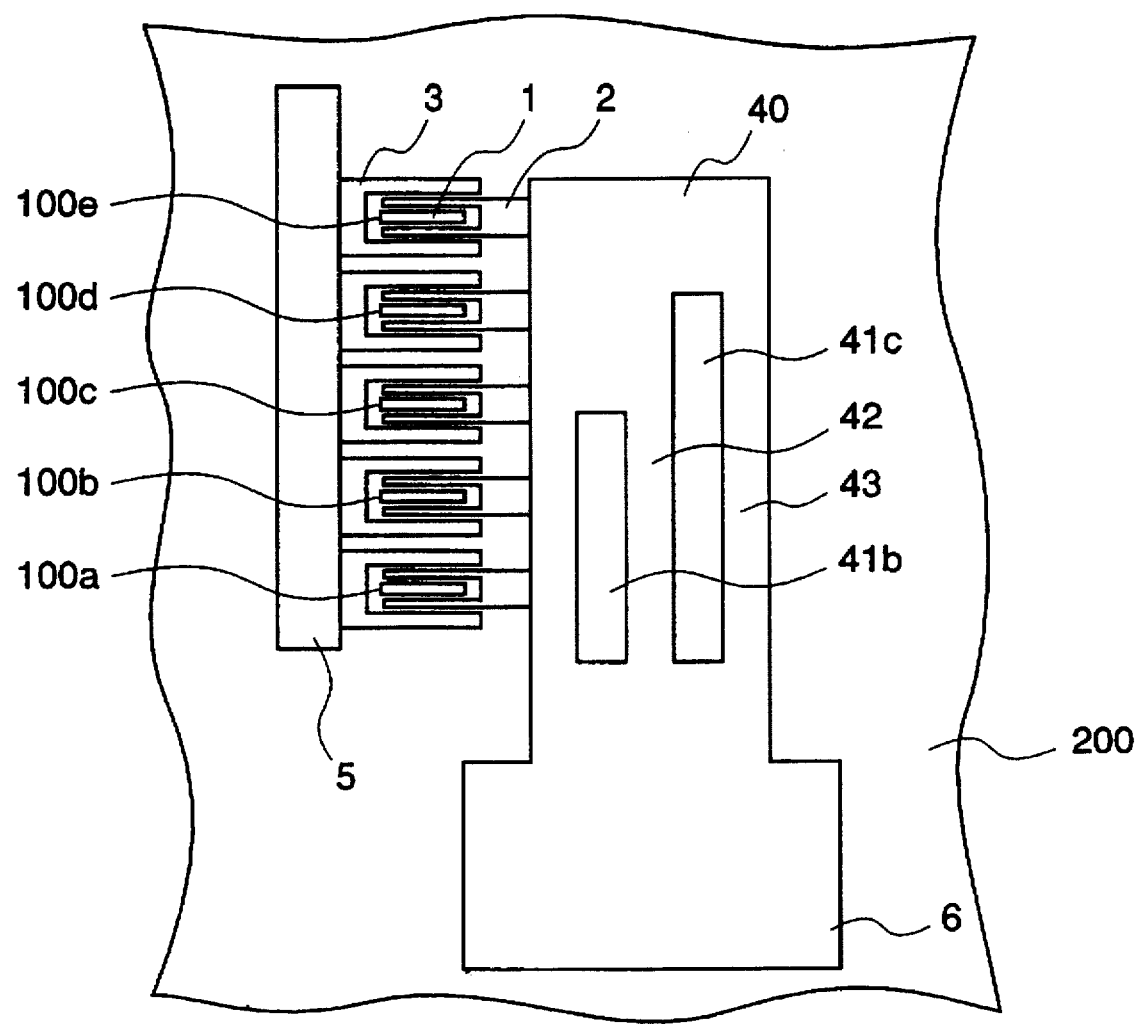
FIG. 30 is a diagram illustrating a fundamental structure of a high power bipolar transistor as a second example according to the fourth embodiment of the present invention.
Figure 31:
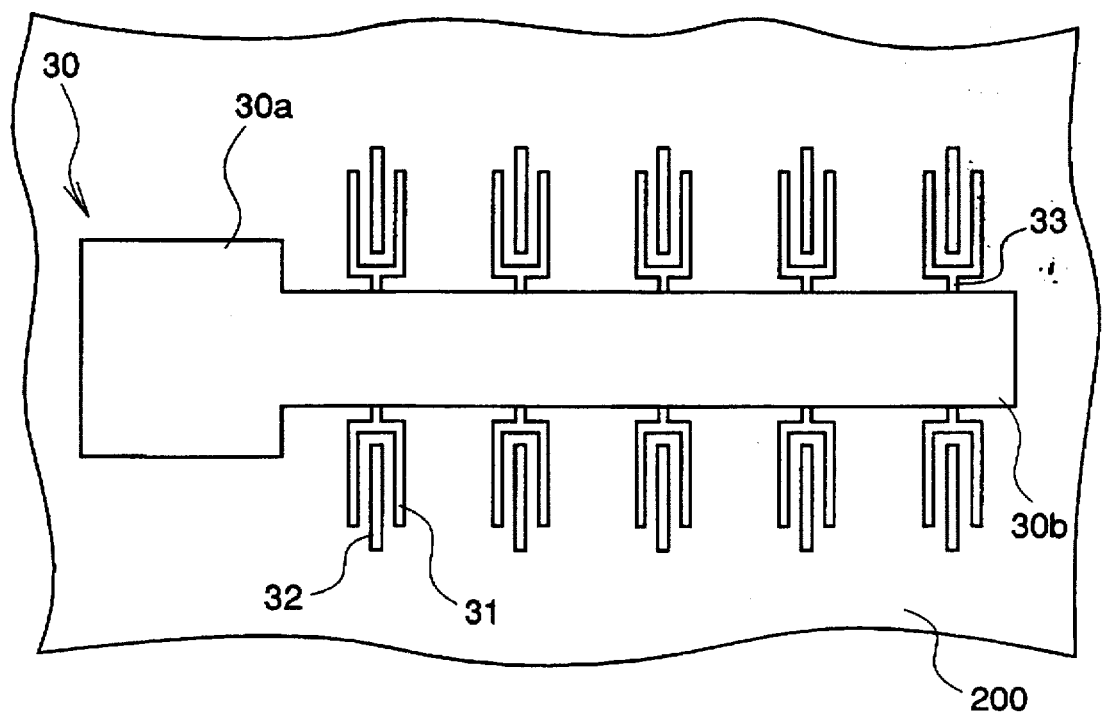
FIG. 31 is a diagram illustrating an example of a base wiring of a prior art high power bipolar transistor.
Figure 32:
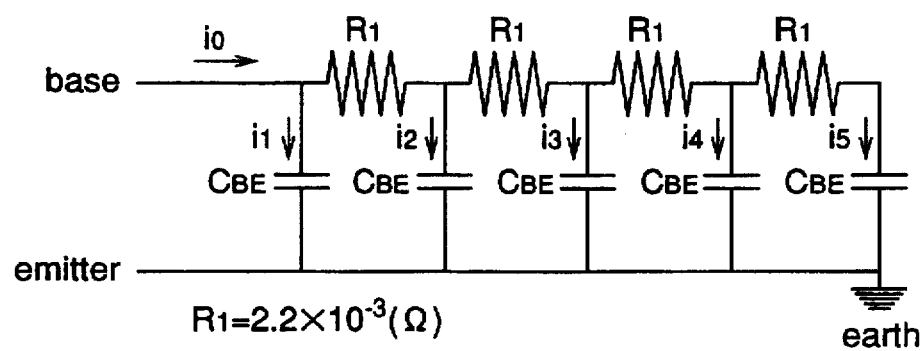
FIG. 32 is a diagram illustrating an equivalent circuit of the prior art high power bipolar transistor.

FIG. 30 is a diagram illustrating an emitter grounded type high power bipolar transistor as a second example according to the fourth embodiment of the present invention. While in the third example of the first embodiment plural bypass lines connected to the base feed lines are provided, this second example a base feed line 40 having a relatively wide width is employed and a plurality of apertures 40b and 41c are formed therein so that the base feed line regions separated by the apertures 40b and 41c serve as bypass lines 42 and 43, respectively.

By providing such a construction, input signals are supplied to the respective transistors more uniformly, whereby more uniform operation of the respective transistors 100a–100e is enabled. In addition, the processes for forming multiple wiring patterns can be eliminated.

Also in this fourth embodiment, as in the third embodiment, bipolar transistors each having a structure in which an emitter is disposed at the periphery of a collector may be employed, as the respective emitter grounded high power bipolar transistors.

What is claimed is:

1. A high power bipolar transistor device comprising:

a substrate;

a plurality of bipolar transistors disposed on substrate;

a signal line including a pad for inputting a driving signal and a signal transmission line continuous with the pad commonly connecting base electrodes of the bipolar transistors; and a bypass line having a first end connected to the signal transmission line proximate to the pad and a second end connected to the signal transmission line remote from the pad.

2. The high power bipolar transistor device of claim 1 wherein the first end of the bypass line is connected to the signal transmission line closer to the pad than a node connecting the base electrode to the transistor closest to the pad to the signal transmission line.

3. The high power bipolar transistor device of claim 2 wherein the bypass line comprises an electrical conductor partly spaced from the substrate.

4. The high power bipolar transistor device of claim 1 including an auxiliary bypass line having a first end connected to the signal transmission line further from the pad than a node connecting the first end of the bypass line to the signal transmission line, and a second end connected to the signal transmission line closer to the pad than a node connecting the second end of the bypass line to the signal transmission line.

5. The high power bipolar transistor device of claim 1 wherein the bypass line comprises an air bridge or a wire partly spaced from the substrate.

6. The high power bipolar transistor device of claim 1 including a branching line in the bypass line and having an end connected to the signal transmission line intermediate respective connections of the bypass line to the signal transmission line.

7. The high power bipolar transistor device of claim 1 wherein the respective high power bipolar transistors include respective collectors and respective emitters and the collectors are peripherally disposed at the emitters.

8. The high power bipolar transistor device of claim 1 wherein the respective high power bipolar transistors include respective emitters and respective collectors and the emitters are peripherally disposed at the collectors.

9. A high power bipolar transistor device comprising:

a substrate;

a plurality of bipolar transistors disposed on the substrate; and a signal line including a pad for inputting a driving signal, a first signal transmission line continuous with the pad and commonly connecting base electrodes of a first group of transistors positioned remote from the pad, and a second signal transmission line continuous with the pad and commonly connecting base electrodes of a second group of transistors positioned proximate to the pad, each of the plurality of transistors being connected to the pad by one of the first and second signal transmission lines.

10. The high power bipolar transistor device of claim 9 wherein the first and second signal transmission lines have respective first and second line widths and the second line width is narrower than the first line width.

11. The high power bipolar transistor device of claim 9 wherein the first signal transmission and the second signal transmission line have respective, equal lengths from the pad to the first and second groups of bipolar transistors.

12. The high power bipolar transistor device of claim 9 wherein each of the transistors has an emitter area and the sum of the emitter areas of the transistors of the first group of transistors and the sum of the emitter areas of the second group of transistors are equal to each other.

13. A high power bipolar transistor device comprising:

a substrate;

a plurality of bipolar transistors disposed on the substrate;

a pad for inputting a driving signal, and a plurality of signal transmission lines continuous with the pad, each signal transmission line being independently connected to a respective bipolar transistor, and having a respective line width, the signal transmission lines connecting bipolar transistors remote from the pad having wider line widths than transmission lines connecting bipolar transistors located proximate to the pad.

14. A high power bipolar transistor device comprising;

a substrate:

a plurality of bipolar transistors disposed on the substrate;

a pad for inputting a driving signal; and a plurality of signal transmission lines continuous with the pad, each Signal transmission line being independently connected to a respective bipolar transistor, the transmission lines having respective lengths, the lengths of the respective signal transmission lines from the respective bipolar transistors to the pad being equal to each other.

15. A high power bipolar transistor device comprising:

a substrate;

a plurality of bipolar transistors disposed on the substrate; and a signal line comprising a pad for inputting a driving signal and a signal transmission line continuous with the pad, connected to base electrodes of the plurality of the bipolar transistors, and including an aperture in a longitudinal direction of the signal transmission line extending from proximate to the pad toward a remote end of the signal transmission line.

16. The high power bipolar transistor device of claim 15 including a plurality of apertures in the signal transmission line, the apertures extending from the pad toward the remote end of the signal transmission line.

* * * * *